United States Patent
Naohara et al.

(10) Patent No.: US 11,322,415 B2
(45) Date of Patent: May 3, 2022

(54) SUBSTRATE TREATMENT METHOD AND SUBSTRATE TREATMENT DEVICE

(71) Applicant: SCREEN Holdings Co., Ltd., Kyoto (JP)

(72) Inventors: Hideji Naohara, Kyoto (JP); Yuji Okita, Kyoto (JP); Hiroaki Kakuma, Kyoto (JP); Tatsuya Masui, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 109 days.

(21) Appl. No.: 16/591,649

(22) Filed: Oct. 3, 2019

(65) Prior Publication Data
US 2020/0111715 A1     Apr. 9, 2020

(30) Foreign Application Priority Data
Oct. 5, 2018   (JP) ............................. JP2018-189981

(51) Int. Cl.
*H01L 21/66*     (2006.01)
*H01L 21/02*     (2006.01)
(Continued)

(52) U.S. Cl.
CPC .............. *H01L 22/12* (2013.01); *G06K 9/628* (2013.01); *G06T 7/0004* (2013.01); *G06T 7/13* (2017.01); *G06T 7/73* (2017.01); *H01L 21/02087* (2013.01); *H01L 21/67253* (2013.01); *G06T 2207/20081* (2013.01);
(Continued)

(58) Field of Classification Search
CPC ......... H01L 21/02087; H01L 21/67253; H01L 21/67051; H01L 21/68; H01L 21/6708; H01L 21/67242; H01L 21/68764; H01L 21/68742
See application file for complete search history.

(56) References Cited

U.S. PATENT DOCUMENTS

| 9,555,436 B2 | 1/2017 | Uemae et al. |
| 10,058,900 B2 | 8/2018 | Fujiwara et al. |

(Continued)

FOREIGN PATENT DOCUMENTS

| JP | 2008135679 | 6/2008 |
| JP | 2015018848 | 1/2015 |

(Continued)

*Primary Examiner* — Bac H Au
(74) *Attorney, Agent, or Firm* — JCIPRNET

(57) ABSTRACT

A substrate treatment method is provided, including: holding a substrate on a substrate holding unit; rotating the substrate holding unit to rotate the substrate; raising a cup member surrounding an outer periphery of the substrate holding unit to locate an upper end of the cup member in an upper end position higher than an upper surface of the substrate held on the substrate holding unit; discharging a treatment liquid from a discharge port of a nozzle located lower than the upper end position to an end portion of the upper surface of the substrate held on the substrate holding unit; an imaging process, acquiring captured images of an imaging region by a camera, wherein the imaging region contains the treatment liquid discharged from the discharge port and is seen from an imaging position above the substrate; and determining a discharge state of the treatment liquid based on the captured images.

10 Claims, 14 Drawing Sheets

(51) Int. Cl.
  *H01L 21/67*  (2006.01)
  *G06T 7/00*  (2017.01)
  *G06T 7/73*  (2017.01)
  *G06K 9/62*  (2022.01)
  *G06T 7/13*  (2017.01)
  *H04N 5/235*  (2006.01)

(52) U.S. Cl.
  CPC .............. *G06T 2207/20216* (2013.01); *G06T 2207/30148* (2013.01); *H04N 5/2353* (2013.01)

(56) References Cited

U.S. PATENT DOCUMENTS

| | | | |
|---|---|---|---|
| 10,286,648 B2 | 5/2019 | Inagaki | |
| 10,475,670 B2* | 11/2019 | Yoshihara | ......... H01L 21/67253 |
| 10,665,481 B2 | 5/2020 | Sano et al. | |
| 2008/0100809 A1 | 5/2008 | Nakashima et al. | |
| 2015/0013722 A1 | 1/2015 | Amano et al. | |
| 2015/0262848 A1 | 9/2015 | Sano et al. | |
| 2017/0028426 A1 | 2/2017 | Kakuma | |
| 2017/0294300 A1* | 10/2017 | Kozai | ............... H01L 21/68728 |
| 2018/0345327 A1 | 12/2018 | Fujiwara et al. | |
| 2019/0096730 A1* | 3/2019 | Morita | .................. H01L 23/544 |
| 2019/0259172 A1 | 8/2019 | Kakuma et al. | |

FOREIGN PATENT DOCUMENTS

| | | |
|---|---|---|
| JP | 2015173148 | 10/2015 |
| JP | 2016122681 | 7/2016 |
| JP | 2017029883 | 2/2017 |
| JP | 2018032766 | 3/2018 |
| KR | 20150035383 | 4/2015 |
| KR | 20160037088 | 4/2016 |
| TW | 201808465 | 3/2018 |
| TW | 201823689 | 7/2018 |

* cited by examiner

SUBSTRATE TREATMENT METHOD AND SUBSTRATE TREATMENT DEVICE

CROSS REFERENCE TO RELATED APPLICATIONS

This application claims the priority benefit of Japanese Patent Application No. 2018-189981, filed on Oct. 5, 2018. The entirety of the above-mentioned patent application is hereby incorporated by reference herein and made a part of this specification.

BACKGROUND OF THE DISCLOSURE

Technical Field

The disclosure relates to a substrate treatment method and a substrate treatment device.

Related Art

As a device performing treatment on a substrate, a substrate treatment device that discharges a treatment liquid from a discharge nozzle to a surface of a substrate while rotating the substrate plane surface is used. The treatment liquid arriving substantially at a center of the substrate from the discharge nozzle expands on the whole surface due to a centrifugal force accompanying the rotation of the substrate and scatters outward from a peripheral edge of the substrate. By the expanding of the treatment liquid on the whole surface of the substrate, the treatment liquid can act on the whole surface of the substrate. A chemical liquid, a rinsing liquid or the like corresponding to the treatment performed on the substrate is employed as the treatment liquid.

In this type of substrate treatment device, a technology is put forth in which a camera is arranged to monitor whether the treatment liquid is appropriately discharged (Japanese Patent Application Laid-Open No. 2015-173148, No. 2017-29883, No. 2015-18848, No. 2016-122681, and No. 2008-135679).

In addition, in a manufacturing process of a semiconductor substrate, various films remaining on a peripheral end portion of the substrate may have side effect on a device surface of the substrate.

Therefore, conventionally, a beveling treatment for removing the films from the peripheral end portion of the substrate is put forth. In the beveling treatment, a treatment liquid for removal is discharged from the discharge nozzle to an end portion of the substrate while the substrate is rotated in the plane surface, and thereby the films on the peripheral end portion of the substrate is removed by the treatment liquid.

In the beveling treatment, the treatment liquid may be supplied to only the end portion of the substrate, and thus a flow rate of the treatment liquid is small. That is, the liquid-column shaped treatment liquid discharged from the discharge nozzle becomes thin. Hence, the liquid-column shaped treatment liquid is easily influenced by various factors such as an air flow accompany the rotation of the substrate and static electricity generated nearby, and the discharge state changes easily.

However, in the beveling treatment, a gap between the discharge nozzle and the substrate is narrow, and thus contrivance is required to image the liquid-column shaped treatment liquid discharged from the discharge nozzle.

SUMMARY

In one embodiment of the disclosure, a substrate treatment method is provided, including: a holding process in which a substrate is held on a substrate holding unit; a rotation process in which the substrate holding unit is rotated to rotate the substrate; a raising process in which a cup member surrounding an outer periphery of the substrate holding unit is raised to locate an upper end of the cup member in an upper end position higher than an upper surface of the substrate held on the substrate holding unit; a beveling treatment process in which a treatment liquid is discharged from a discharge port of a nozzle located lower than the upper end position to an end portion of the upper surface of the substrate held on the substrate holding unit; an imaging process in which a camera is made to image an imaging region to acquire captured images, wherein the imaging region is an imaging region contains the treatment liquid discharged from the discharge port of the nozzle and is seen from an imaging position above the substrate held on the substrate holding unit; and a monitoring process in which a discharge state of the treatment liquid is determined based on the captured images.

Because the camera images the imaging region seen from the imaging position above the substrate, the treatment liquid discharged from the nozzle can be appropriately imaged, and the discharge state can be appropriately determined based on the captured images.

In another embodiment of the disclosure, a substrate treatment device is provided, including: a substrate holding unit that holds a substrate and rotates the substrate; a cup member that surrounds an outer periphery of the substrate holding unit; a raising/lowering mechanism that raises the cup member to locate an upper end of the cup member in an upper end position higher than an upper surface of the substrate held on the substrate holding unit; a nozzle that has a discharge port located in a position lower than the upper end position and discharges a treatment liquid from the discharge port to an end portion of the upper surface of the substrate held on the substrate holding unit; a camera that images an imaging region to acquire captured images, wherein the imaging region contains the treatment liquid discharged from the discharge port of the nozzle and is seen from an imaging position above the substrate held on the substrate holding unit; and an image processing unit that determines a discharge state of the treatment liquid based on the captured images.

Because the camera images the imaging region seen from the imaging position above the substrate, the treatment liquid discharged from the nozzle can be appropriately imaged, and the discharge state can be appropriately determined based on the captured images.

DESCRIPTION OF THE EMBODIMENTS

Embodiments are described below with reference to the accompanying diagrams. Moreover, the diagrams are schematically shown, and configurations are properly omitted or simplified for convenience of description. In addition, sizes and relative position relationships of the configurations and the like shown in the diagrams are not necessarily correct and may be properly changed.

In addition, in the description shown below, the same configurations are denoted by the same symbols, and the terms and functions thereof are also the same. Therefore, detailed description of these configurations may be omitted to avoid repetition.

<Outline of Substrate Treatment Device>

Figure 1:
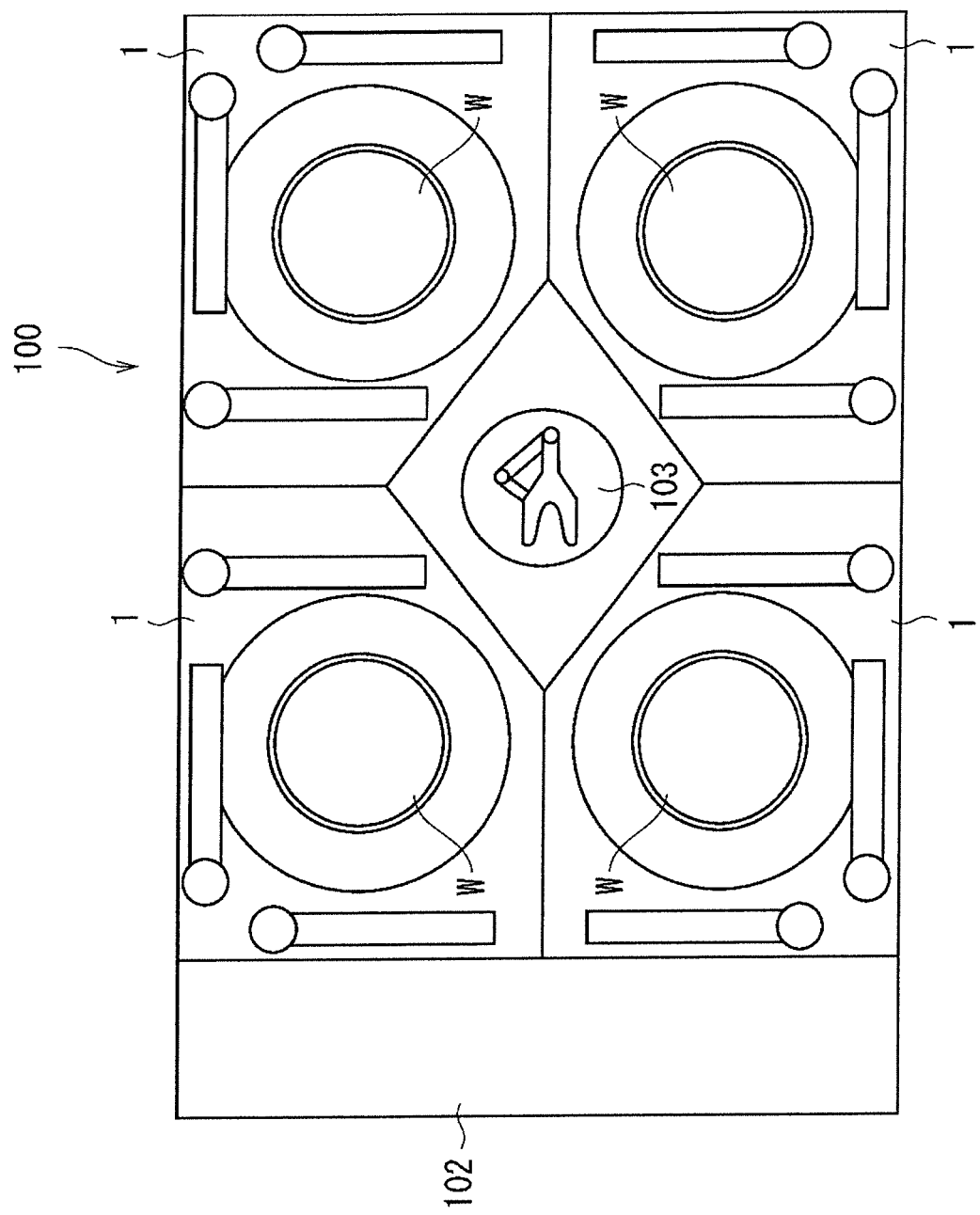
FIG. 1 is a diagram illustrating an example of a schematic configuration of a substrate treatment device.

FIG. 1 is a diagram illustrating the overall configuration of a substrate treatment device 100. The substrate treatment device 100 is a device supplying a treatment liquid to a substrate W to perform a treatment for the substrate W. The substrate W is, for example, a semiconductor substrate. The substrate W has a substantially disk shape.

The substrate treatment device 100 can remove unwanted substance attached to a peripheral end portion of the substrate W by supplying a treatment liquid to an end portion of the substrate W while rotating the substrate W in a plane surface. A width of the peripheral end portion (width along a radial direction) is, for example, about 0.5-3 [mm]. The unwanted substance may be, for example, a film such as a $SiO_2$ film, a SiN film and a polysilicon film, particles and the like. The treatment liquid for removing the unwanted substance may be fluorinated acid (HF), phosphoric acid ($H_3PO_4$), a mixture solution (SC-1) of ammonia ($NH_3$) and hydrogen peroxide($H_2O_2$), nitrohydrofluoric acid (a mixture liquid of fluorinated acid and nitric acid ($HNO_3$)), and the like. The substrate treatment device 100 removes the unwanted substance by supplying the treatment liquid to the end portion of the substrate W while rotating the substrate W. The above treatment is also referred to as a beveling treatment.

The substrate treatment device 100 includes an indexer 102, a plurality of treatment units 1 and a conveyance robot 103. The indexer 102 has a function of transferring an untreated substrate W received from the outside of the device into the device and moving the already treated substrate W out of the device. The indexer 102 has a plurality of carriers placed thereon and includes a delivery robot (both are not shown). A FOUP (front opening unified pod) or SMIF (Standard Mechanical Inter Face) pod that stores the substrate W in a closed space, or an OC (open cassette) that exposes the substrate W to external atmosphere in a state of storing the substrate W can be employed as the carrier. The delivery robot delivers the substrate W between the carriers and the conveyance robot 103.

12 treatment units 1 are arranged in the substrate treatment device 100. The specific arrangement configuration is that four towers in which three treatment units 1 are laminated are arranged so as to surround the conveyance robot 103. In other words, the four treatment units 1 arranged surrounding the conveyance robot 103 are laminated in three stages, and one of the layers in shown in FIG. 1. Moreover, the number of the treatment units 1 mounted on the substrate treatment device 100 is not limited to 12 and may be, for example, 8 or 4.

The conveyance robot 103 is arranged at the center of the four towers in which the treatment units 1 are laminated. The conveyance robot 103 transfers the untreated substrate W received from the indexer 102 into each of the treatment units 1 and moves the already treated substrate W out of each of the treatment units 1 and passes the already treated substrate W to the indexer 102.

<Treatment Unit>

Figure 2:
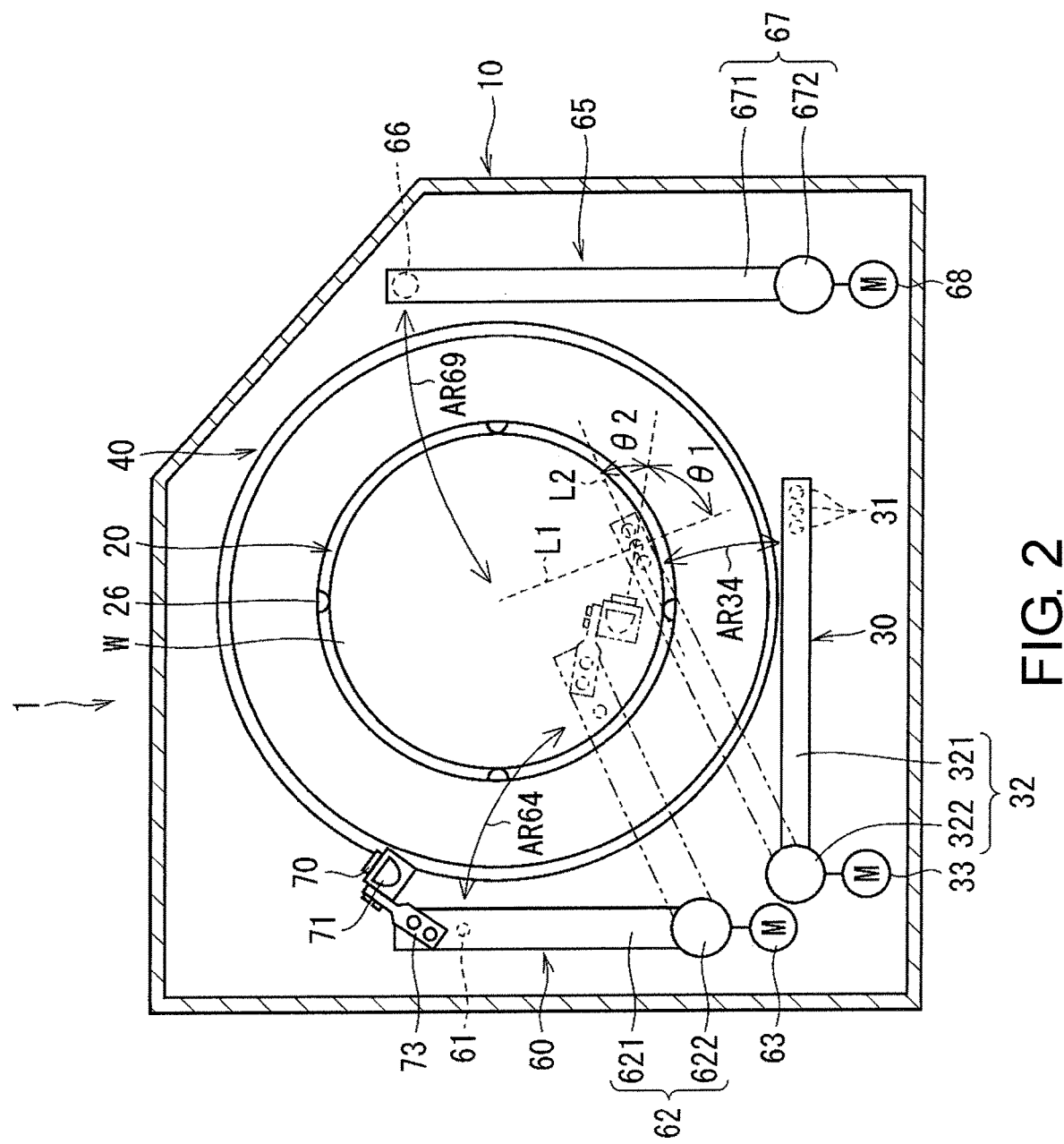
FIG. 2 is a plan view illustrating an example of a schematic configuration of a treatment unit.
Figure 3:
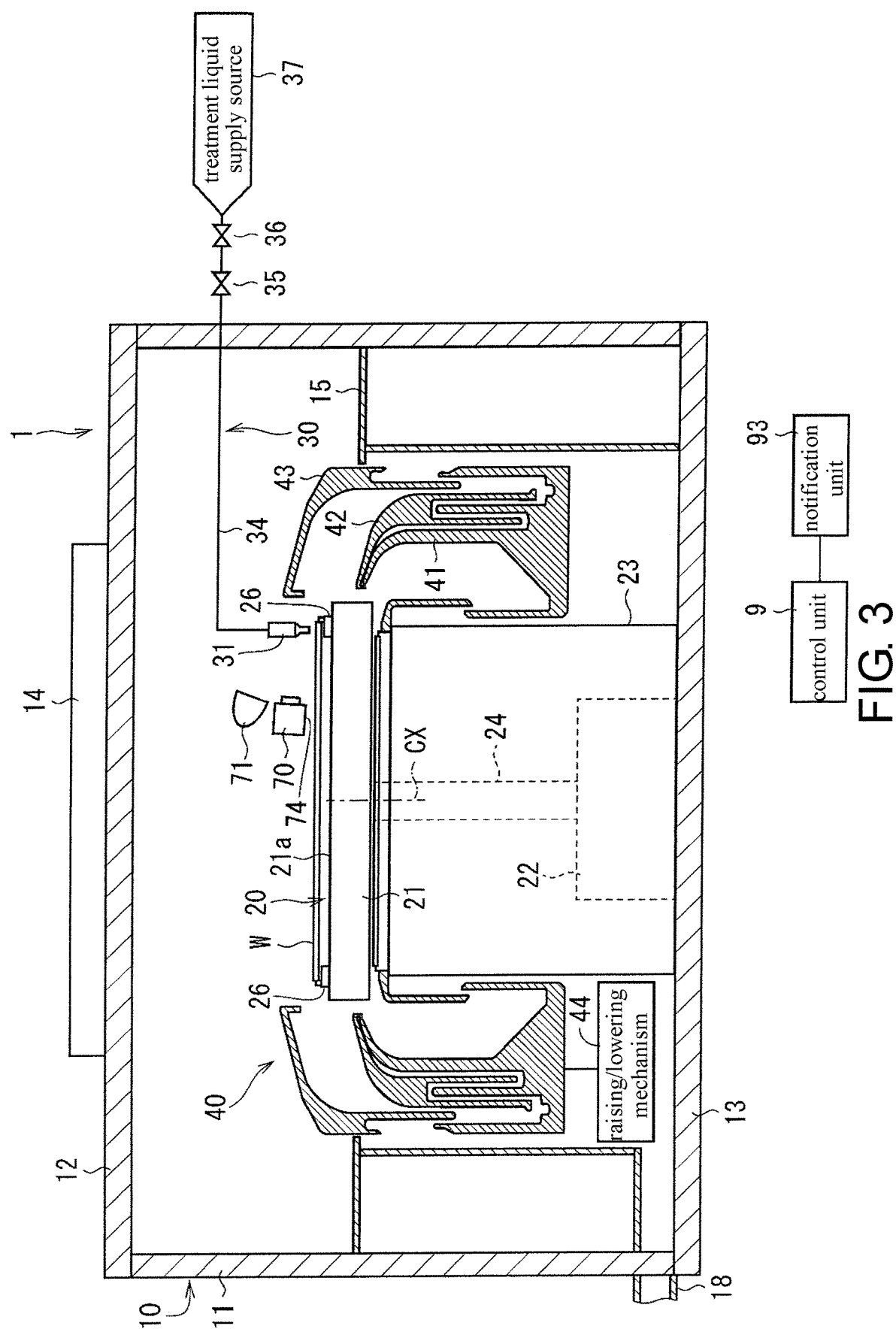
FIG. 3 is a cross-sectional view illustrating an example of a schematic configuration of the treatment unit.

Next, the treatment units 1 is described. In the following, one of the 12 treatment units 1 mounted on the substrate treatment device 100 is described, and the same applies to other treatment units 1. FIG. 2 is a plan view of the treatment unit 1. In addition, FIG. 3 is a longitudinal cross-sectional view of the treatment unit 1.

The treatment unit 1 includes, inside a chamber 10, a substrate holding unit 20 holding the substrate W in a horizontal posture (a posture in which a normal line of the substrate W is along a vertical direction), three treatment liquid supplying units 30, 60, 65 for supplying the treatment liquid to an upper surface of the substrate W held on the substrate holding unit 20, a treatment cup (cup member) 40 enclosing the surrounding of the substrate holding unit 20, and a camera 70, as main elements. In addition, around the treatment cup 40 inside the chamber 10, a partition plate 15 that partitions the internal space of the chamber 10 into an upper space and a lower space is arranged. In addition, in the treatment unit 1, a control unit 9 and a notification unit 93 are arranged.

<Chamber>

The chamber 10 includes a side wall 11 along the vertical direction, a ceiling wall 12 that blocks an upper side of the space surrounded by the side wall 11 and a floor wall 13 that blocks a lower side. The space surrounded by the side wall 11, the ceiling wall 12 and the floor wall 13 is a treatment space of the substrate W. In addition, on a part of the side wall 11 of the chamber 10, a carrying in/out port through which the conveyance robot 103 carries the substrate W into or out of the chamber 10 and a shutter for opening and closing the carrying in/out port are arranged (both are not shown).

On the ceiling wall 12 of the chamber 10, a fan filter unit (FFU) 14 is mounted which is used to further clean the air inside a clean room where the substrate treatment device 100 is disposed and supplies the air to the treatment space inside the chamber 10. The fan filter unit 14 includes a fan and filter (for example, HEPA filter) for taking in the air inside the clean room and sends the air out to the chamber 10, and forms a down flow of clean air in the treatment space inside the chamber 10. To uniformly disperse the clean air supplied from the fan filter unit 14, a punching plate in which multiple blow-out holes are drilled may be arranged right below the ceiling wall 12.

<Substrate Holding Unit>

The substrate holding unit 20 is, for example, a spin chuck. The substrate holding unit 20 includes a disk-shaped spin base 21 fixed, in a horizontal posture, to an upper end of a rotation shaft 24 extending along the vertical direction. A spin motor 22 that rotates the rotation shaft 24 is arranged below the spin base 21. The spin motor 22 rotates the spin base 21 in a plane surface via the rotation shaft 24. In addition, a tubular cover member 23 is arranged so as to enclose the surrounding of the spin motor 22 and the rotation shaft 24.

The external diameter of the disk-shaped spin base 21 is slightly larger than the diameter of the circular substrate W held on the substrate holding unit 20. Hence, the spin base 21 has a holding surface 21a facing the entire lower surface of the substrate W to be held.

A plurality of (four in this embodiment) chuck pins 26 is erected on a peripheral edge portion of the holding surface 21a of the spin base 21. The plurality of chuck pins 26 are disposed with equal intervals (when there are four chuck pins 26 as in this embodiment, with intervals of 90°) along a circumference corresponding to an outer peripheral circle of the circular substrate W. The plurality of chuck pins 26 are driven together by a link mechanism accommodated in the spin base 21 and not shown. By bringing each of the plurality of chuck pins 26 into contact with an outer periphery end of the substrate W to grasp the substrate W, the substrate holding unit 20 can hold the substrate W above the spin base 21 in a horizontal posture of approaching the holding surface 21a (see FIG. 3), and can separate each of the plurality of chuck pins 26 from the outer periphery end of the substrate W to release the grasp.

In a state that the substrate holding unit 20 holds the substrate W by the grasp of the plurality of chuck pins 26, the spin motor 22 rotates the rotation shaft 24, and thereby the substrate W can be rotated around a rotation axis CX along the vertical direction passing through the center of the substrate W. Here, the substrate holding unit 20 rotates in a counterclockwise direction in FIG. 2.

<Treatment Liquid Supplying Unit>

The treatment liquid supplying unit 30 includes a discharge nozzle 31, a fixing member 32 and a movement mechanism 33. The fixing member 32 is for fixing the discharge nozzle 31 and includes, for example, a nozzle arm 321 and a nozzle base 322. The discharge nozzle 31 is mounted to a distal end of the nozzle arm 321. A base end side of the nozzle arm 321 is fixed and coupled to the nozzle base 322. The movement mechanism 33 moves the discharge nozzle 31 by displacing the fixing member 32. For example, the movement mechanism 33 is a motor and rotates the nozzle base 322 around an axis along the vertical direction. By the rotation of the nozzle base 322, as shown by an arrow AR34 in FIG. 2, the discharge nozzle 31 moves in an arc shape along the horizontal direction between a treatment position above the end portion of the substrate W and a standby position on the outer side of the treatment cup 40.

The treatment liquid supplying unit 30 may include a plurality of discharge nozzles 31. In the example of FIG. 2 and FIG. 3, three discharge nozzles 31 are shown as the discharge nozzle 31. The three discharge nozzles 31 are fixed to the nozzle base 322 via the nozzle arm 321. Hence, the three discharge nozzles 31 move synchronically. The three discharge nozzles 31 are arranged in positions lined up along a periphery direction of the substrate W in the treatment position. The interval between the three discharge nozzles 31 in a periphery direction is, for example, about a dozen millimeters.

As shown in FIG. 3, the discharge nozzle 31 is connected to a treatment liquid supply source 37 via a pipe 34. A switching valve 35 is arranged in the midway of the pipe 34. A discharge port (not shown) is formed on a lower surface of the distal end of the discharge nozzle 31. By opening the switching valve 35, the treatment liquid from the treatment liquid supply source 37 flows through the interior of the pipe 34 and is discharged from the discharge port of the discharge nozzle 31. The treatment liquid discharged in a state that the discharge nozzle 31 stops at the treatment position arrives at the end portion of the upper surface of the substrate W held on the substrate holding unit 20. By the rotation of the substrate W, the treatment liquid from the discharge nozzle 31 is supplied to the whole region of the peripheral end portion of the substrate W, and unwanted substance of the peripheral end portion is removed (beveling treatment).

Suck back valves 36 may be respectively arranged in the midway of the pipe 34. The suck back valve 36 sucks in the treatment liquid inside the pipe 34 when the discharge of the treatment liquid is stopped, thereby drawing in the treatment liquid from the distal end of the discharge nozzle 31. Accordingly, when the discharge is stopped, dripping in which the treatment liquid falls from the distal end of the discharge nozzle 31 in the form of relatively large bulk (liquid droplet) is unlikely to occur.

When a plurality of discharge nozzles 31 is arranged, the discharge nozzles 31 may be connected to mutually different treatment liquid supply sources 37. That is, the treatment liquid supplying unit 30 may be configured to supply a plurality types of treatment liquids. Alternatively, at least two of the plurality of discharge nozzles 31 may supply the same treatment liquid.

In addition, in the treatment unit 1 of this embodiment, two treatment liquid supplying units 60 and 65 are further arranged besides the aforementioned treatment liquid supplying unit 30. The treatment liquid supplying units 60 and 65 of this embodiment have a configuration the same as the configuration of the treatment liquid supplying unit 30. That is, the treatment liquid supplying unit 60 has a discharge nozzle 61, a fixing member 62 and a movement mechanism 63. Similar to the fixing member 32, the fixing member 62 has a nozzle arm 621 and a nozzle base 622. A discharge nozzle 61 is mounted on the distal end of the nozzle arm 621, and the nozzle base 622 is coupled to the base end. The movement mechanism 63 is a motor for example, and moves, by turning the nozzle base 622, the discharge nozzle 61 in an arc shape between the treatment position above the end portion of the substrate W and the standby position on the outer side of the treatment cup 40, as shown by an arrow AR64. The discharge nozzle 61 also supplies the treatment liquid to the end portion of the substrate W. By the rotation of the substrate W, the treatment liquid from the discharge nozzle 61 is supplied to the entire region of the peripheral end portion of the substrate W, and unwanted substance of the peripheral end portion is removed (beveling treatment).

The treatment liquid supplying unit 65 has a discharge nozzle 66, a fixing member 67 and a movement mechanism 68. The fixing member 67 has a nozzle arm 671 and a nozzle base 672. The discharge nozzle 66 is mounted on a distal end of the nozzle arm 671, and the nozzle base 672 is coupled to a base end of the nozzle arm 671. The movement mechanism 68 is a motor for example, and moves, by turning the nozzle base 672, the discharge nozzle 66 in an arc shape between the treatment position above the substantial center of the substrate W and the standby position on the outer side of the treatment cup 40, as shown by an arrow AR69. The discharge nozzle 61 supplies the treatment liquid to the substantial center of the substrate W. By the rotation of the substrate W, the treatment liquid from the discharge nozzle 66 expands from the center of the substrate W to be scattered to the outer side from the peripheral edge of the substrate W. Accordingly, the treatment liquid can be made to act on the entire upper surface of the substrate W.

A plurality of treatment liquids may also be supplied to each of the treatment liquid supplying units 60 and 65. Alternatively, single treatment liquid may be supplied to each of the treatment liquid supplying units 60 and 65.

In a state that respective discharge nozzles 61 and 66 are located in the treatment position, the treatment liquid supplying units 60 and 65 discharges the treatment liquid to the upper surface of the substrate W held on the substrate holding unit 20. Moreover, at least one of the treatment liquid supplying units 60 and 65 may be a two-fluid nozzle which mixes a rinsing liquid such as pure water with a pressurized gas to form liquid droplets and jets a mixture fluid of the liquid droplets and a gas to the substrate W. In addition, the treatment liquid supplying unit arranged on the treatment units 1 is not limited to the number of three and one or more treatment liquid supplying units are sufficient. Similar to the treatment liquid supplying unit 30, each discharge nozzle of the treatment liquid supplying units 60 and 65 may also be connected to the treatment liquid supply source via a pipe, and a switching valve may be arranged in the midway of the pipe, furthermore, a suck back valve may be arranged. In the following, a beveling treatment using the treatment liquid supplying unit 30 is typically described.

<Treatment Cup>

The treatment cup 40 is arranged to enclose the substrate holding unit 20. The treatment cup 40 includes an inner cup 41, a middle cup 42 and an outer cup 43. The inner cup 41, the middle cup 42 and the outer cup 43 are arranged to be capable of raising and lowering. Specifically, a raising/lowering mechanism 44 is arranged on the treatment unit 1, and the raising/lowering mechanism 44 can raise/lower the inner cup 41, the middle cup 42 and the outer cup 43 separately. The raising/lowering mechanism 44 has, for example, a ball screw mechanism.

In a state that the inner cup 41, the middle cup 42 and the outer cup 43 are raised, an upper end of the treatment cup 40 (here, an upper end of the outer cup 43) is located above the upper surface of the substrate W. In the following, a height position of the upper end of the outer cup 43 in the state that the outer cup 43 is raised is also referred to as upper end position of the treatment cup 40. A gap between the upper end position of the treatment cup 40 and the substrate W in the vertical direction may be set to, for example, about 2 [mm]-a dozen [mm].

In the state that the inner cup 41, the middle cup 42 and the outer cup 43 are raised, the treatment liquid scattered from the peripheral edge of the substrate W comes into contact with an inner periphery surface of the inner cup 41 and drips. The dripping treatment liquid is appropriately recovered by a first recovery mechanism (not shown). In a state that the inner cup 41 is lowered and the middle cup 42 and the outer cup 43 are raised, the treatment liquid scattered from the peripheral edge of the substrate W comes into contact with an inner periphery surface of the middle cup 42 and drips. The dripping treatment liquid is appropriately recovered by a second recovery mechanism (not shown). In a state that the inner cup 41 and the middle cup 42 is lowered and the outer cup 43 is raised, the treatment liquid scattered from the peripheral edge of the substrate W comes into contact with an inner periphery surface of the outer cup 43 and drips. The dripping treatment liquid is appropriately recovered by a third recovery mechanism (not shown). Accordingly, different treatment liquids can be appropriately recovered, respectively.

In the following description, the state that the outer cup 43 is raised is set as the state that the treatment cup 40 is raised. That is, the state that the treatment cup 40 is raised includes the state that all of the inner cup 41, the middle cup 42 and the outer cup 43 are raised, the state that only the middle cup 42 and the outer cup 43 are raised, and the state that only the outer cup 43 is raised.

<Partition Plate>

The partition plate 15 is arranged to partition the internal space of the chamber 10 into an upper space and a lower space around the treatment cup 40. The partition plate 15 may be a piece of plate-like member that encloses the treatment cup 40 or a member in which a plurality of plate-like members is joined together. In addition, a throughhole or a notch that penetrates the partition plate 15 in a thickness direction may be formed in the partition plate 15; in this embodiment, through-holes (not shown) through which supporting shafts pass are formed, the supporting shafts are used to support the nozzle base 322, 622 and 672 of the treatment liquid supplying units 30, 60 and 65 pass.

The outer periphery end of the partition plate 15 is coupled to the side wall 11 of the chamber 10. In addition, an end edge portion of the partition plate 15 that encloses the treatment cup 40 is formed into a circular shape having a diameter larger than an external diameter of the outer cup 43. Hence, the partition plate 15 does not hinder the raising and lowering of the outer cup 43.

In addition, an exhaust duct 18 is arranged in the vicinity of the floor wall 13, the vicinity being part of the side wall 11 of the chamber 10. The exhaust duct 18 is connected to and communicates with an exhaust mechanism not shown. Among the clean air supplied from the fan filter unit 14 and flows down in the chamber 10, the air pass through the space between the treatment cup 40 and the partition plate 15 is discharged to the outside from the exhaust duct 18.

<Camera>

The camera 70 is disposed inside the chamber 10 and above the partition plate 15. The camera 70 is, for example, an optical system including an imaging element (for example, CCD (Charge Coupled Device)), an electronic shutter, a lens and the like. The camera 70 can image an imaging region described later. That is, the imaging region is a region seen from an imaging position above the substrate W, and is a region including the distal end of the discharge nozzle 31 at the treatment position, and the substantially liquid-column shaped treatment liquid discharged from the distal end to the end portion of the substrate W (see also FIG. 3).

Figure 4:
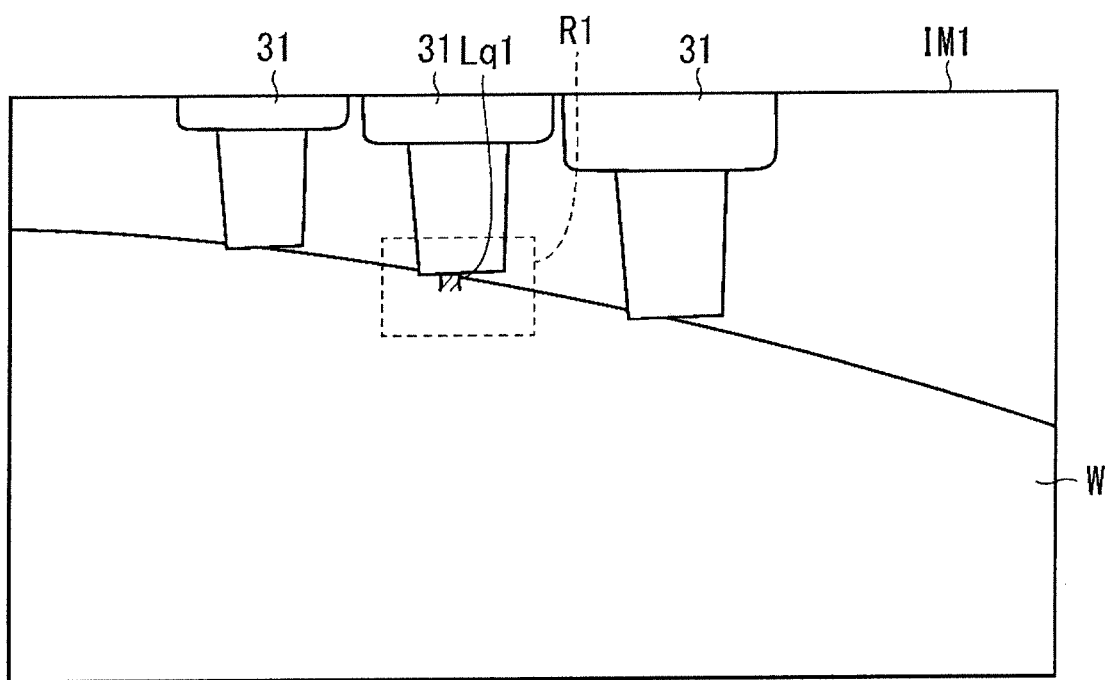
FIG. 4 is a diagram schematically illustrating an example of a captured image acquired by a camera.

FIG. 4 is a diagram schematically showing an example of image data (hereinafter, referred to as captured image) IM1 acquired by the camera 70. In the example of FIG. 4, the captured image IM1 includes the distal end of three discharge nozzles 31. The captured image IM1 includes a substantially liquid-column shaped treatment liquid Lq1 discharged from the discharge nozzle 31 located at the center of the three discharge nozzles 31. Here, the substantially liquid-column shaped treatment liquid Lq1 refers to the treatment liquid Lq1 flows down toward the upper surface of the substrate W from the distal end of the discharge nozzle 31. The camera 70 outputs the captured image IM1 to the control unit 9.

As illustrated in FIG. 2, the camera 70 may be arranged to be movable. In the example of FIG. 2, the camera 70 is fixed to the fixing member 62 of the treatment liquid supplying unit 60. As a more specific example, a camera holding unit 73 that holds the camera 70 is arranged, and the camera holding unit 73 is coupled to the nozzle arm 621 of the fixing member 62. For example, the camera holding unit 73 is fixed, at the base end side thereof, to a distal end portion of the nozzle arm 621 by a fastening member (for example, a screw), and fixes and holds the camera 70 by a fastening member at a distal end side of the camera holding unit 73. The camera holding unit 73 is made of, for example, metal (for example, stainless steel) or the like. The movement mechanism 63 displaces the fixing member 62, thereby moving the camera 70 to the imaging position above the substrate W. Specifically, the movement mechanism 63 can make the camera 70 reciprocate between the imaging position above the substrate W and the standby position on the outer side of the treatment cup 40 by turning the nozzle base 622.

In the example in FIG. 2, the standby position of the discharge nozzle 31 is positioned shifted from the standby position of the camera 70 for about 90° in the clockwise direction. The discharge nozzle 31 and the camera 70 move from the respective standby position to get close to each other and stop at the treatment position and the imaging position, respectively. The camera 70 is held at the imaging position by the camera holding unit 73 in a posture at which the imaging region including the distal end of the discharge nozzle 31 and the liquid-column shaped treatment liquid Lq1 discharged from the distal end can be imaged. In the example of FIG. 2, the camera holding unit 73 protrudes obliquely to a clockwise direction side with respect to the nozzle arm 621 and holds the camera 70 at the distal end of the camera holding unit 73.

Here, an example of the position relationship between the camera 70 and the discharge nozzle 31 is described, the discharge nozzle 31 being stopped at the treatment position and the camera 70 being stopped at the imaging position. In the following, the discharge nozzle 31 positioned at the center of the three discharge nozzles 31 is used to describe the position relationship.

In the example of FIG. 2, the camera 70 is positioned at a central side of the substrate W with respect to the discharge nozzle 31 in a plan view. That is, the radial position of the camera 70 with respect to the substrate W is positioned closer to the central side of the substrate W than the radial position of the discharge nozzle 31.

In addition, in the example of FIG. 2, the camera 70 images the distal ends of the three discharge nozzles 31 from a direction closer to the periphery direction than the radial direction of the substrate W in a plan view. That is, the peripheral position of the camera 70 with respect to the substrate W shifts to one side with respect to the peripheral position of the discharge nozzle 31. Furthermore, in other words, in a plan view, an angle θ1 (0<θ1<90) formed by an imaginary straight line L1 and an optical axis of the camera 70 is larger than an angle θ2 (0<θ2<90) formed by an imaginary straight line L2 and the optical axis of the camera 70, the imaginary straight line L1 connecting the center of the substrate W with the discharge nozzle 31 and the imaginary straight line L2 being perpendicular to the straight line L1. Accordingly, in the captured image IM1, a radial position of an arrival position of the treatment liquid Lq1 with respect to the substrate W can be easily seen. However, when the angle θ2 is too small, the three discharge nozzles 31 may be lined up and overlapped in a depth direction when viewed from the imaging position. In this case, it is difficult to include all of the three discharge nozzles 31 in the captured image IM1, and thus the angle θ2 may be set in a manner that the three discharge nozzles 31 are properly shifted in a horizontal direction when viewed from the imaging position.

In addition, the camera 70 images the imaging region from a direction closer to the periphery direction, and thereby the three discharge nozzles 31 are mutually shifted in the depth direction when viewed from the imaging position. The interval between the three discharge nozzles 31 in the depth direction is, for example, about several millimeters to a dozen of millimeters. A depth of field of the camera 70 is set to be large enough so that profiles of the three discharge nozzles 31 are clear. In addition, the distance between the camera 70 and the discharge nozzle 31 is, for example, about 100 [mm].

In the example of FIG. 2, the camera 70 is located at an upstream side in a rotation direction of the substrate holding unit 20 with respect to the discharge nozzle 31. At the upstream side with respect to the discharge nozzle 31, the amount of the treatment liquid Lq1 on the peripheral end portion of the substrate W may be less than the amount in a case of the downstream side. The reason is that the treatment liquid Lq1 may scatter to the outside from the peripheral edge of the substrate W along with the rotation of the substrate W. Hence, if the camera 70 is located at the upstream side with respect to the discharge nozzle 31, the treatment liquid Lq1 is unlikely to adhere to the camera 70 or gasified components of the treatment liquid Lq1 are unlikely to affect the camera 70. That is, from the point of view of protecting the camera 70, the camera 70 may be located at the upstream side with respect to the discharge nozzle 31.

Additionally, the reason is that, when the discharge nozzle 31 discharges the treatment liquid Lq1, the treatment cup 40 is in a state of raising. The treatment liquid Lq1 scattering from the peripheral edge of the substrate W is received by the treatment cup 40. In this state, the distal end of the discharge nozzle 31 (discharge port) is located lower than the upper end position of the treatment cup 40. For example, the gap in the vertical direction between the upper end position of the treatment cup 40 and the upper surface of the substrate W is set to about 2 [mm]-a dozen [mm], and the gap between the discharge nozzle 31 and the substrate W is set to about 2 [mm] or smaller (for example, about 1 [mm]).

Here, a case in which the imaging position of the camera 70 is set at the outer side of the treatment cup 40 is described for comparison. For example, the imaging position is set at a side close to the discharge nozzle 31 (an upper-right region in the chamber 10 in FIG. 3) in the space at the outer side of the treatment cup 40. Because the upper end position of the treatment cup 40 is located higher than the distal end of the discharge nozzle 31, the treatment cup 40 may hinder the imaging. That is, even if the substantially liquid-column shaped treatment liquid Lq1 is to be imaged from the imaging position at the outer side of the treatment cup 40, the treatment liquid Lq1 may be blocked by the treatment cup 40. When the imaging position is set to a higher position to avoid the treatment cup 40, the discharge nozzle 31 is imaged diagonally from above. Because the gap between the distal end of the discharge nozzle 31 and the substrate W is narrow, if the substantially liquid-column shaped treatment liquid Lq1 is to be imaged diagonally from above, the treatment liquid Lq1 may be blocked by the discharge nozzle 31.

Therefore, it is also considered to set, in the space at the outer side of the treatment cup 40, the imaging position at an opposite side (an upper-left region in the chamber 10 in FIG. 3) of the discharge nozzle 31 with respect to the center of the substrate W. Accordingly, it may be possible to image the substantially liquid-column shaped treatment liquid Lq1 discharged from the discharge nozzle 31. However, the distance between the distal end of the discharge nozzle 31 and the imaging position of the camera 70 increases, and thus a camera 70 with high resolution or a telephoto camera 70 is required.

In contrast, in this embodiment, the imaging position is above the substrate W, and thus it is easy to get the imaging position close to the upper surface of the substrate W in the height direction, and it is easy to make the optical axis of the camera 70 go along the horizontal direction. Hence, the camera 70 is not blocked by the treatment cup 40 and the discharge nozzle 31 and can image the substantially liquid-column shaped treatment liquid Lq1 discharged from the discharge nozzle 31. An angle formed by the optical axis of the camera 70 and a plane surface may be set to, for example, about a dozen [degree] or lower.

In addition, the camera 70 can also be brought close to the discharge nozzle 31 in a plan view. Hence, a more inexpensive camera having lower resolution or not requiring a telephoto function can be employed. Such a camera has a small size and thus becomes suitable. In the example in FIG. 4, because the distance between the camera 70 and the discharge nozzle 31 short, the captured image IM1 includes only a part of the peripheral edge of the substrate W.

Here, an example of the imaging position of the camera 70 in the height direction is described. The imaging position of the camera 70 may be set in a manner that a lower end of a light reception surface of an imaging element of the camera 70 is positioned at the same height as the upper end position of the treatment cup 40 or lower than the upper end position. For example, the distance between the camera 70 and the upper surface of the substrate W may be set to about 1 [mm]-5 [mm]. Accordingly, the camera 70 can be brought closer to the upper surface of the substrate W, and the optical axis of the camera 70 can be further made to go along the horizontal direction.

Alternatively, the imaging position of the camera 70 may be set in a manner that a lower end of a housing of the camera 70 is positioned at the same height as the upper end position of the treatment cup 40 or lower than the upper end position.

Figure 5:
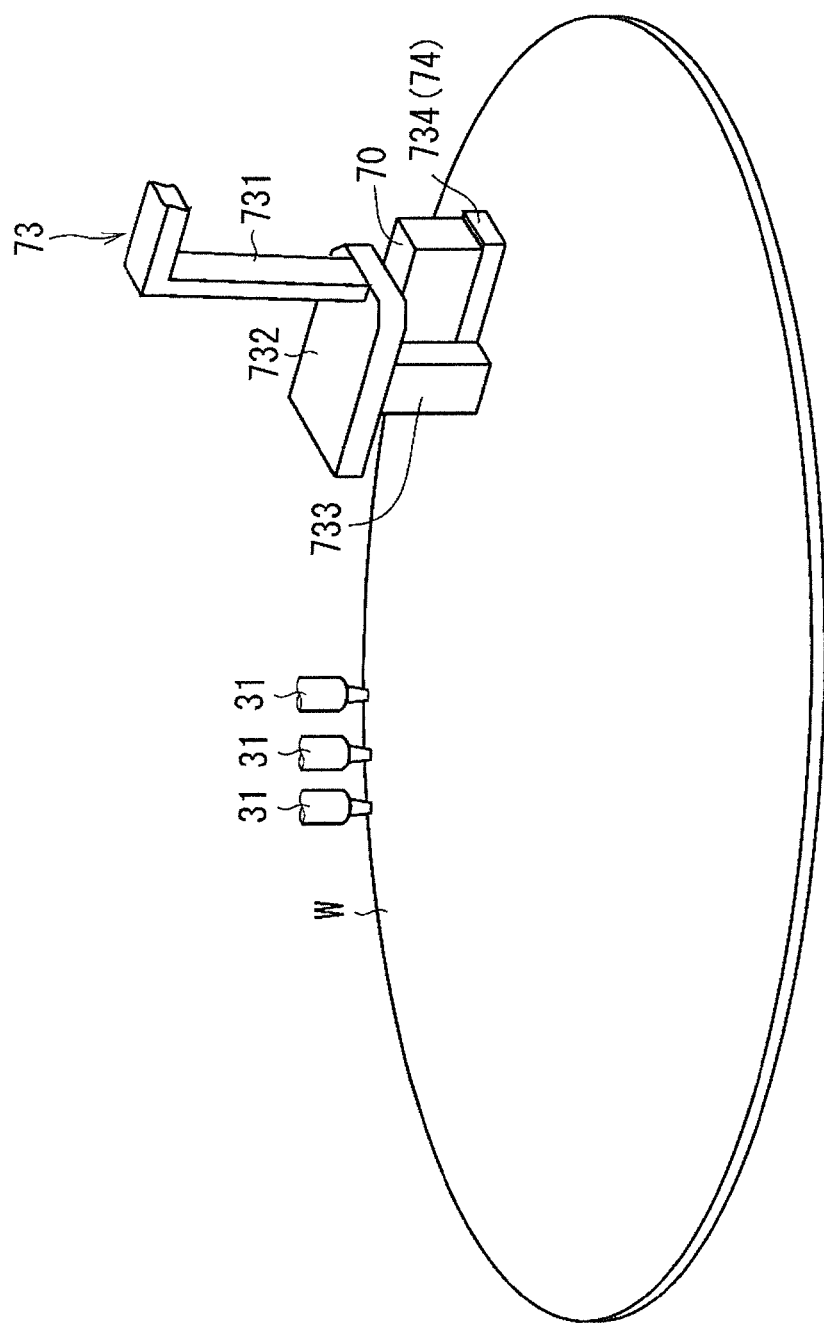
FIG. 5 is a perspective view schematically illustrating an example of configurations of the camera and a camera holding unit.

In addition, there are cases that the camera holding unit 73 supports a lower surface of the camera 70. FIG. 5 is a perspective view schematically showing an example of the camera 70 and the camera holding unit 73, and the substrate W and the discharge nozzle 31 are also shown in FIG. 5. In the example of FIG. 5, the camera holding unit 73 has an L-shaped coupling member 731, an upper surface member 732 located on the upper surface side of the camera 70, a lateral member 733 located at a lateral surface side of the camera 70, and a lower member 734 located at a lower surface side of the camera 70. The coupling member 731 has a first bar-like member extending in the horizontal direction from the nozzle arm 621, and a second bar-like member extending downward in the vertical direction from a distal end of the first bar-like member. A distal end of the second bar-like member is coupled to the upper surface member 732. In the example of FIG. 5, the upper surface member 732, the lateral member 733 and the lower member 734 has a plate shape. The upper surface member 732 and the lower member 734 are disposed in a posture in which the thickness direction goes along the vertical direction, and the lateral member 733 is disposed in a posture in which the thickness direction goes along the horizontal direction. The lateral member 733 couples the upper surface member 732 and the lower member 734. The lower member 734 also functions as a supporting member that supports the camera 70.

In this structure, the imaging position of the camera 70 may be set in a manner that a lower end of the lower member 734 is positioned at the same height as the upper end position of the treatment cup 40 or lower than the upper end position. Accordingly, the camera 70 can also be brought closer to the upper surface of the substrate W, and the optical axis of the camera 70 can be further made to go along the horizontal direction.

<Illumination Unit>

As shown in FIG. 3, an illumination unit 71 is arranged inside the chamber 10 and above the partition plate 15. The illumination unit 71 includes, for example, a light source such as LED (Light Emitting Diode). Wavelength of the light irradiated from the illumination unit 71 is not particularly limited; however, for example, visible lights or near-infrared light may be employed. In the example in FIG. 3, the illumination unit 71 is disposed above the camera 70. For example, the illumination unit 71 is disposed at a position overlapping the camera 70 in a plan view (see FIG. 2). The illumination unit 71 may be supported by the camera holding unit 73. For example, the illumination unit 71 may be fixed to an upper surface of the upper surface member 732 of the camera holding unit 73. Usually, the interior of the chamber 10 is dark, and thus the illumination unit 71 irradiates light on the imaging region when the camera 70 captures images.

<Control Unit>

The control unit 9 controls various configurations of the substrate treatment device 100 to perform treatment on the substrate W. In addition, the control unit 9 performs image processing on the captured image IM1 acquired by the camera 70. Hence, the control unit 9 functions as an image processing unit. Because the camera 70 images the distal end of the discharge nozzle 31 from the imaging position above the substrate W, the captured image IM1 acquired by the camera 70 appropriately includes the substantially liquid-column shaped treatment liquid Lq1 discharged from the discharge nozzle 31. The control unit 9 monitors the discharge state of the treatment liquid Lq1 discharged from the discharge nozzle 31 by the image processing to the captured image IM1 (beveling monitoring). An example of the monitoring process is described later in detail.

The configuration serving as hardware of the control unit 9 is the same as a common computer. That is, the control unit 9 is configured to include a CPU for performing various calculation processes, a ROM being a read-only memory that stores basic programs, a RAM being a read-write memory that stores various information, a magnetic disk in which control software, data or the like is stored in advance, and the like. The CPU of the control unit 9 executes predetermined processing programs, and thereby all operation mechanism of the substrate treatment device 100 is controlled by the control unit 9 and processing in the substrate treatment device 100 proceeds. In addition, the CPU of the control unit 9 performs the image processing by executing a predetermined processing program. Moreover, a part of or all of the functions of the control unit 9 may be implemented by dedicated hardware.

<Notification Unit>

A notification unit 93 is, for example, an audio output unit (for example, a speaker), a display, or the like. The notification unit 93 can perform various notification to an operator. For example, various notification can be performed to the operator by the audio output unit outputting a notification sound (buzzer or sound) or the display displaying notification information. The notification of the notification unit 93 is controlled by the control unit 9.

<Operation of Control Unit>

Figure 6:
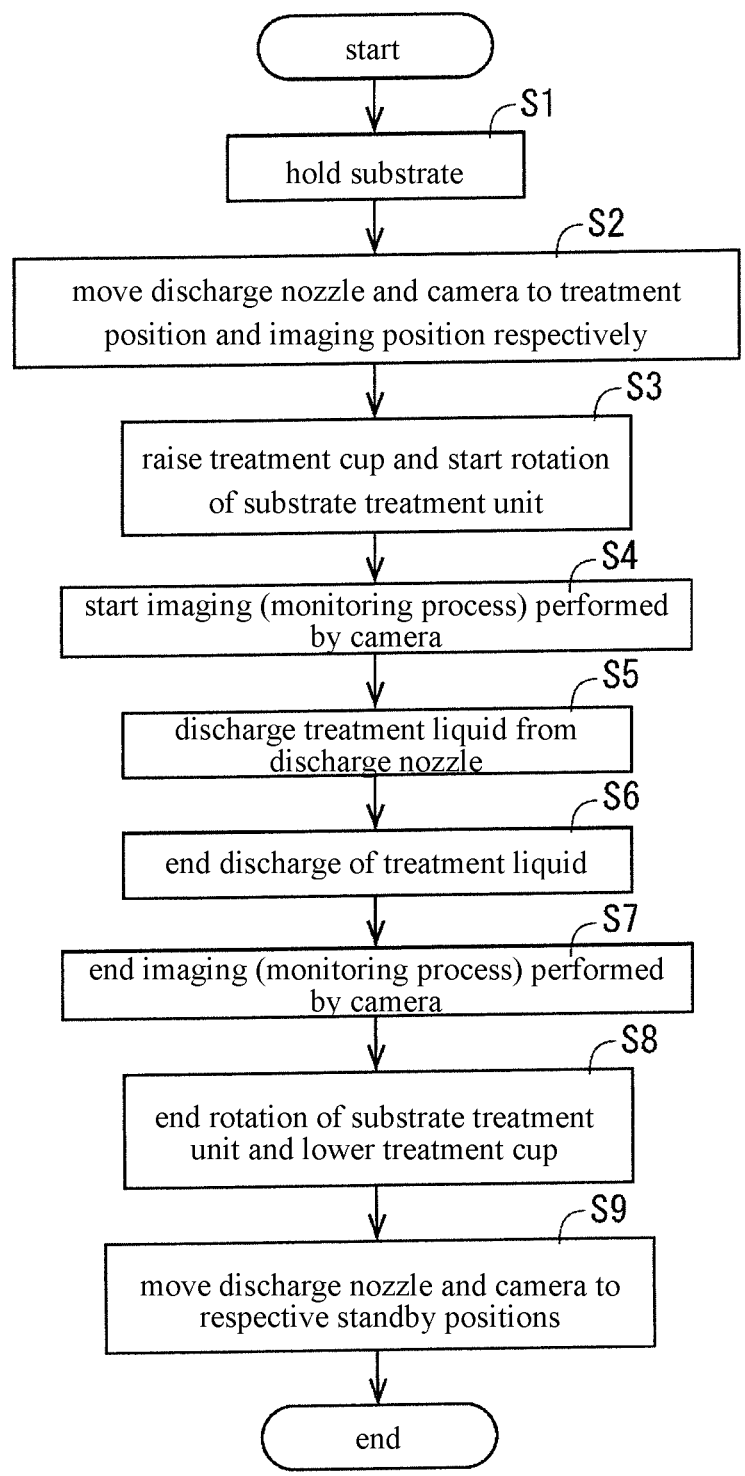
FIG. 6 is a flow chart illustrating an example of a substrate treatment.

FIG. 6 is a flow chart showing an example of the substrate treatment. First, in step S1, the substrate W is conveyed on the substrate holding unit 20 by the conveyance robot 103. The substrate holding unit 20 holds the conveyed substrate W.

Next, in step S2, the control unit 9 controls the movement mechanism 33 to move the discharge nozzle 31 to the treatment position and controls the movement mechanism 63 to move the camera 70 to the imaging position. Next, in step S3, the control unit 9 controls the raising/lowering mechanism 44 to raise the treatment cup 40 and controls the spin motor 22 to rotate the spin base 21. A rotation speed of the spin base 21 is set to, for example, about 1000 [rpm] or higher.

Next, in step S4, the control unit 9 controls the camera 70 to start imaging. The camera 70 images the imaging region at a predetermined frame rate (for example, 60 frames/second) and sequentially outputs the captured images IM1 that are acquired to the control unit 9. The control unit 9 monitors, as described later in detail, the discharge state of the treatment liquid Lq1 based on the image processing to the captured image IM1.

Next, in step S5, the control unit 9 starts the discharge of the treatment liquid Lq1 from the discharge nozzle 31. Specifically, the control unit 9 outputs an open signal to the switching valve 35. The switching valve 35 performs an opening operation based on the open signal to open the pipe 34. Accordingly, the treatment liquid Lq1 from the treatment liquid supply source 37 is discharged from the discharge nozzle 31 and arrives at the end portion of the upper surface of the substrate W. The flow rate of the treatment liquid Lq1 is set to, for example, about several to several ten milliliters per minute (ml/min). This flow rate is smaller than the flow rate of the treatment liquid when the entire surface of the substrate W is treated (for example, the flow rate of the treatment liquid discharged from the discharge nozzle 66 of the treatment liquid supplying unit 65).

By discharging the treatment liquid Lq1 to the end portion of the substrate W while rotating the substrate W, the treatment liquid Lq1 acts on the whole region of the peripheral end portion of the substrate W. Unwanted substance attached to the peripheral end portion of the substrate W can be removed by the treatment liquid Lq1 (beveling treatment). The treatment liquids Lq1 corresponding to types of the unwanted substance (for example, film) may be sequentially discharged from the discharge ports of the three discharge nozzles 31. Moreover, the treatment liquids may be discharged synchronically from at least two discharge ports of the three discharge nozzles 31.

Because the flow rate of the treatment liquid Lq1 in the beveling treatment is small, the treatment liquid Lq1 is easily affected by the air flow accompanying the rotation of the substrate W and liquid splash in which the treatment liquid Lq1 splashes back on the upper surface of the substrate W occurs easily.

Therefore, the control unit 9 monitors the discharge state of the treatment liquid Lq1 in the monitoring process. Specific operation of the monitoring process is described later in detail.

When an ending condition of the beveling treatment is satisfied, in step S6, the control unit 9 stops the discharge of the treatment liquid Lq1 from the discharge nozzle 31. The ending condition of the beveling treatment is not required to be particularly limited, for example, a condition that an elapsed time from step S5 reaches a predetermined time can be employed. In response to the satisfaction of the ending condition, the control unit 9 outputs a close signal to the switching valve 35. The switching valve 35 performs a closing operation based on the close signal to close the pipe 34. Accordingly, the discharge of the treatment liquid Lq1 is ended. Moreover, when the suck back valve 36 is arranged, the control unit 9 outputs a suction signal to the suck back valve 36.

After the discharge of the treatment liquid Lq1 is stopped, a process to dry the substrate W may be appropriately performed. Next, in step S7, the control unit 9 makes the camera 70 end the imaging. That is, the monitoring process is ended. Next, in step S8, the control unit 9 controls the spin motor 22 to end the rotation of the spin base 21 and controls the raising/lowering mechanism 44 to lower the treatment cup 40. Next, in step S9, the control unit 9 controls the movement mechanism 33 and the movement mechanism 63 respectively to moves the discharge nozzle 31 and the camera 70 to the respective standby positions.

Figure 7:
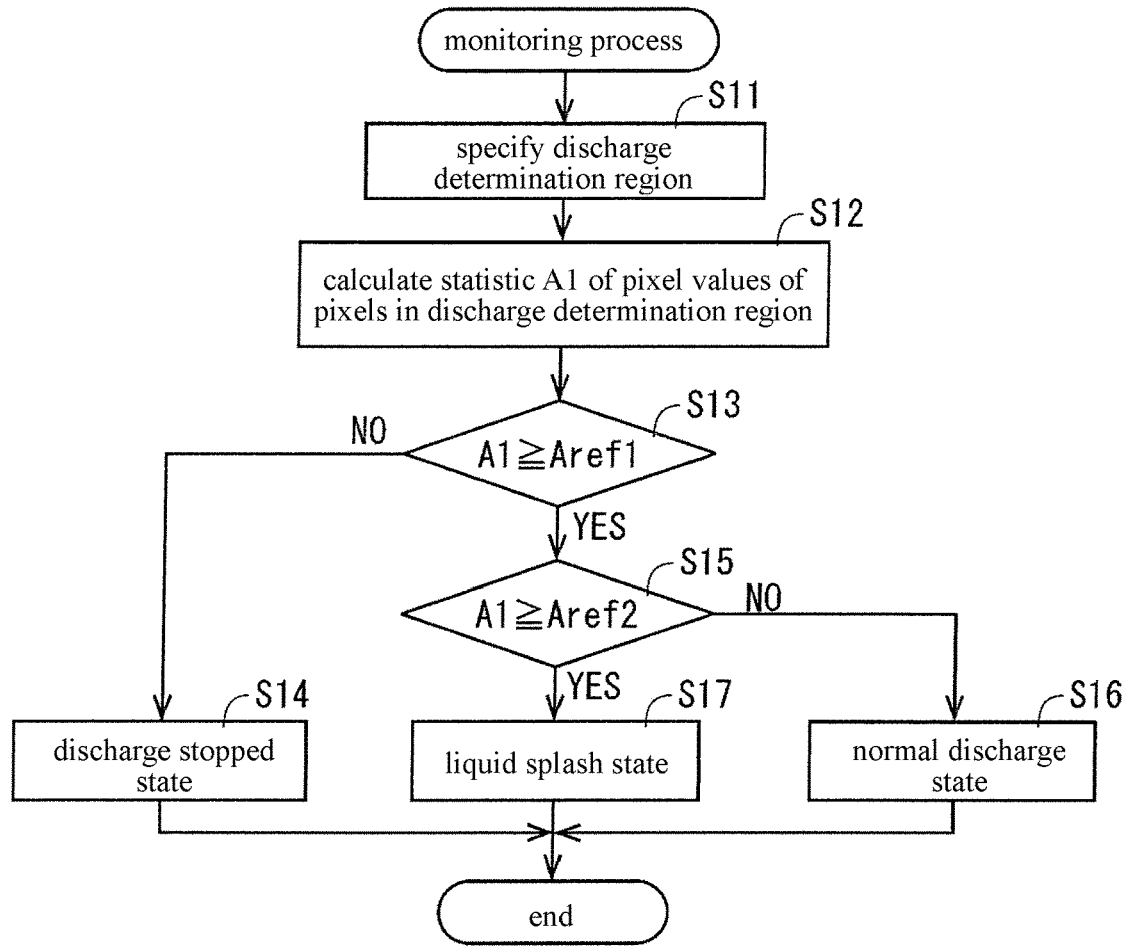
FIG. 7 is a flow chart illustrating an example of a monitoring process.

FIG. 7 is a flow chart showing an example of the operations of the monitoring process. The processing flow shown in FIG. 7 is executed, for example, every time the captured image IM1 is input to the control unit 9. First, in step S11, the control unit 9 specifies a discharge determination region R2 in the captured image IM1, the discharge determination region R2 is to be described later.

Figure 8:
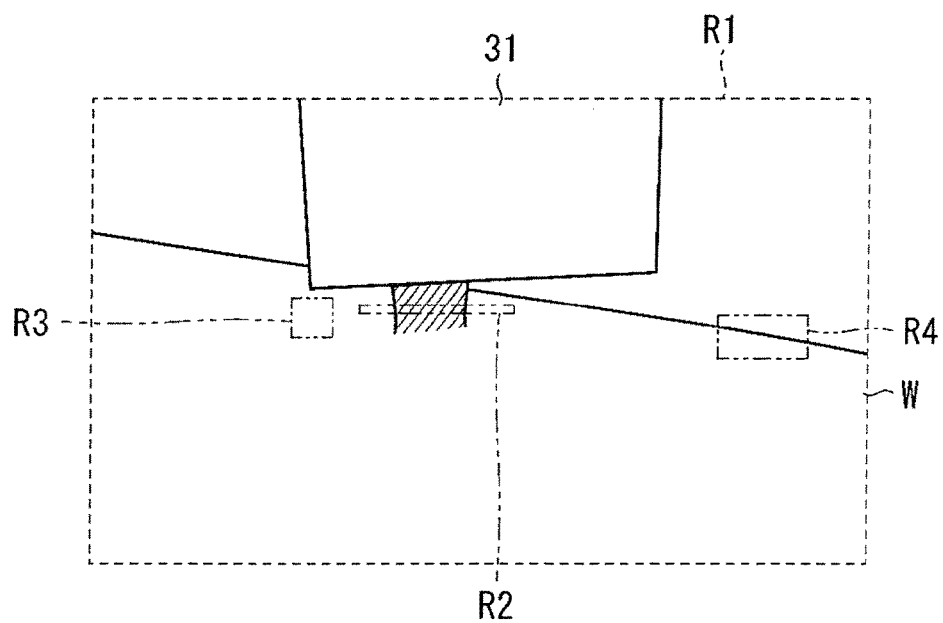
FIG. 8 is a diagram in which part of the captured image is enlarged.

FIG. 8 is a diagram schematically showing an example of an enlarged diagram of the captured image IM1. In the example in FIG. 8, a diagram is shown in which a region R1 near the distal end of one of the discharge nozzles 31 is enlarged. A discharge determination region R2 is a region in the captured image IM1 and right below the discharge nozzle 31, and a region including part of the substantially liquid-column shaped treatment liquid Lq1 discharged from the discharge nozzle 31. The discharge determination region R2 is set at a position separated from the discharge nozzle 31 in the captured image IM1. In addition, the discharge determination region R2 has an elongated shape being long in the lateral direction. That is, a width of the discharge determination region R2 in a longitudinal direction is narrower than a width in the lateral direction. More specifically, the width of the discharge determination region R2 in the lateral direction is set to be wider than a liquid-column width of the treatment liquid Lq1 discharged from the discharge nozzle 31, for example, three times or more of a normal liquid-column width. The position of the discharge determination region R2 in the lateral direction is set so that two ends of the treatment liquid Lq1 in a width direction are included in the discharge determination region R2. The width of the discharge determination region R2 in the longitudinal direction is appropriately set; for example, the width may be a width corresponding to several pixels.

The discharge determination region R2 in the captured image IM1 is set in advance with respect to the discharge nozzle 31. That is, a relative position relationship between the discharge nozzle 31 and the discharge determination region R2 is set in advance. Information indicating this position relationship may be stored in a storage medium of the control unit 9.

Meanwhile, because the relative position of the camera 70 with respect to the discharge nozzle 31 may change corresponding to precision of the movement mechanism 33 and 63, the position of the discharge nozzle 31 in the captured image IM1 may also change. Therefore, the control unit 9 may specify the position of the discharge nozzle 31 in the captured image IM1 and specify the discharge determination region R2 which is in a predetermined position relationship with respect to the discharge nozzle 31. To specify the position of the discharge nozzle 31 in the captured image IM1, a reference image including external appearance of the distal end of the discharge nozzle 31 is also stored in advance in the storage medium of the control unit 9. According to pattern matching based on the reference image, the control unit 9 specifies the position of the discharge nozzle 31 in the captured image IM1, and specifies the discharge determination region R2 with respect to the specified discharge nozzle 31 based on a predetermined relative position relationship. Accordingly, even when the position of the discharge nozzle 31 in the captured image IM1 changes, the discharge determination region R2 can be appropriately specified corresponding to the position of the discharge nozzle 31.

In a state that the discharge nozzle 31 is discharging the treatment liquid Lq1, the discharge determination region R2 includes part of the substantially liquid-column shaped treatment liquid Lq1. Because the light irradiated from the illumination unit 71 is reflected by the treatment liquid Lq1 and received by the camera 70, a luminance value of pixels reflecting the treatment liquid Lq1 is higher than the luminance value of other pixels. Moreover, when the camera 70 is a monochrome camera (gray scale), a pixel value of pixels indicates the luminance value. Here, as an example, the camera 70 is set as a monochrome camera.

Figure 9:
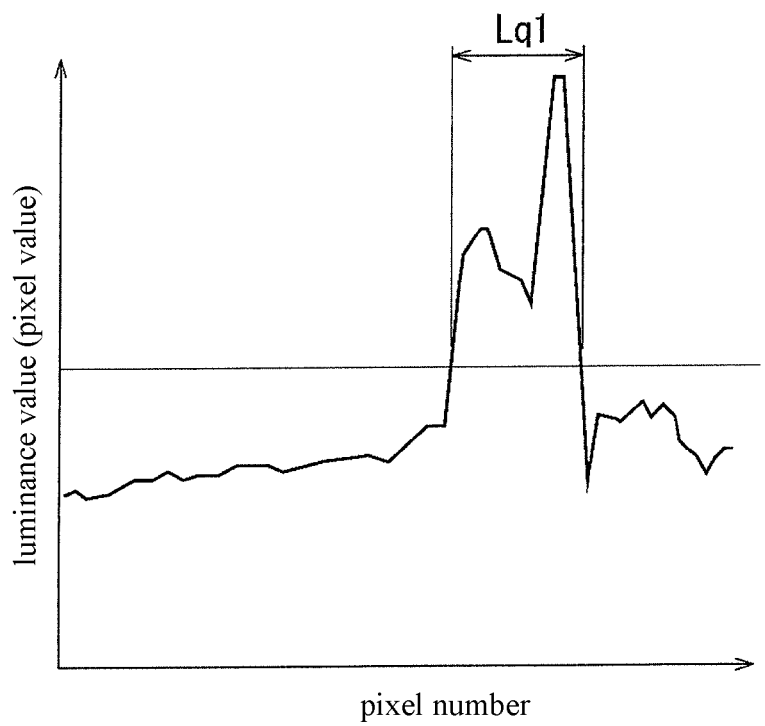
FIG. 9 is a graph illustrating an example of a luminance value of pixels inside a discharge determination region.

FIG. 9 is a graph showing an example of the luminance value (here, pixel value) of the pixels in the discharge determination region R2. The horizontal axis represents pixel numbers of the pixels lined up in a row in the lateral direction in the discharge determination region R2, and the vertical axis represents the pixel values of the pixels lined up in a row in the lateral direction in the discharge determination region R2. As illustrated in FIG. 9, luminance corresponding to the liquid column part of the treatment liquid Lq1 is higher than the surrounding. That is, luminance distribution has featured resulted from the liquid-column shape of the treatment liquid Lq1.

Back to FIG. 7, next in step S12, the control unit 9 calculates a statistic A1 of the pixel values of the pixels in the specified discharge determination region R2. The statistic A1 is a value reflecting the discharge state of the treatment liquid Lq1. The statistic A1 may be, for example, variance (for example, standard deviation) of the pixel values in the discharge determination region R2. The reason is that, due to the discharge of the treatment liquid Lq1, the pixel value of part of the pixels (the pixels corresponding to the treatment liquid Lq1) in the discharge determination region R2 increases (see FIG. 9), and thus the variance increases compared with a case in which the treatment liquid Lq1 is not discharged. That is, the variance can be regarded as a value reflecting whether the treatment liquid Lq1 is discharged or not.

Figure 10:
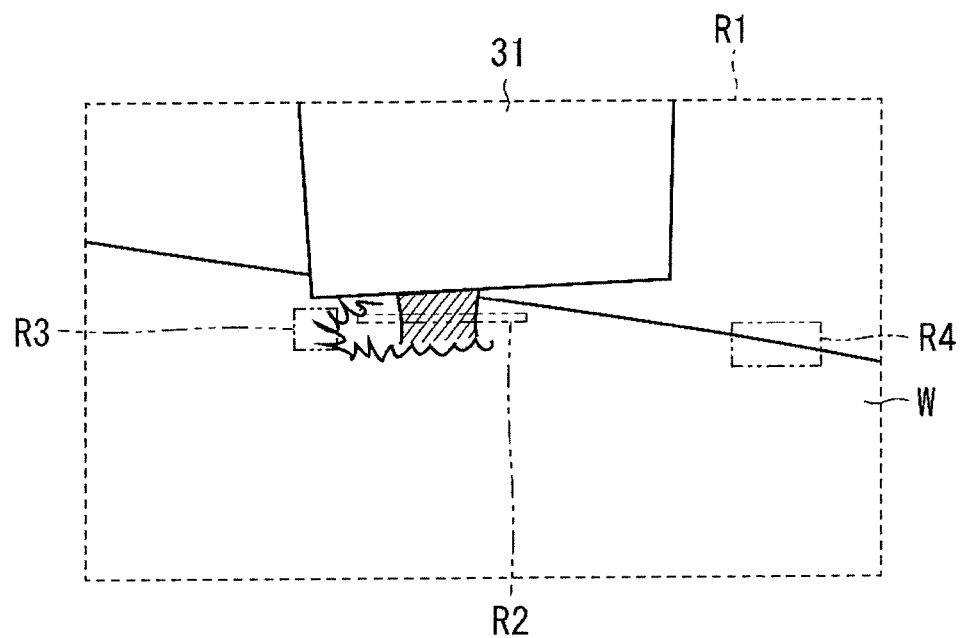
FIG. 10 is a diagram schematically illustrating an example of the captured image.

The variance is also a value reflecting whether there is liquid splash in which the treatment liquid Lq1 discharged from the discharge nozzle 31 splashes back on the upper surface of the substrate W. The reason is described below. FIG. 10 is a diagram schematically showing an example of the captured image IM1 when liquid splash occurs. As illustrated in FIG. 10, when liquid splash occurs, the treatment liquid Lq1 takes up a wider region in the discharge determination region R2. That is, in the discharge determination region R2, the liquid splash part is included beside the liquid-column part of the treatment liquid Lq1, and the treatment liquid Lq1 on the whole takes up a wider region. In the liquid splash part of the treatment liquid Lq1, distribution variation of the luminance value increases compared with the liquid-column part. Therefore, as a result, the variance of the pixel value in the discharge determination region R2 further increases.

Figure 11:
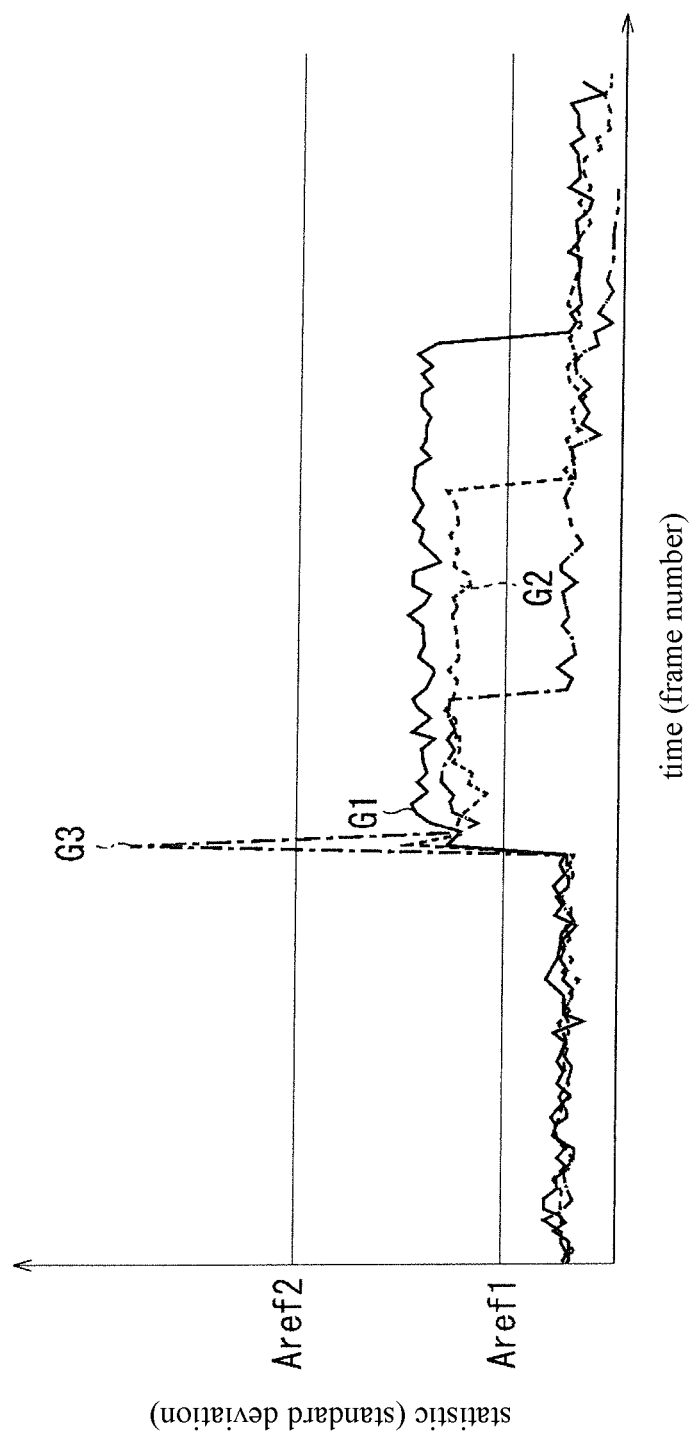
FIG. 11 is a graph illustrating an example of a statistic change over time.

FIG. 11 is a graph showing an example of change of the statistic A1 over time. The horizontal axis represents time. As a parameter indicating the time, for example, frame numbers in the captured image IM1 may be employed. The vertical axis represents the statistic A1. Here, standard deviation may be employed as the statistic A1. In FIG. 11, three graphs G1-G3 having different discharge times of the treatment liquid Lq1 are shown. In the example of FIG. 11, the discharge time in the graph G1 is the longest and the discharge time in the graph G3 is the shortest. In addition, in the graphs G1-G3, the flow rate of the treatment liquid Lq1 is 18 [ml/min], 12 [ml/min] and 8 [ml/min] respectively.

The graph G1 and the graph G2 show the change of the statistic A1 over time when the treatment liquid Lq1 is appropriately discharged. The graph G3 shows the change of the statistic A1 over time when liquid splash occurs immediately after the discharge of the treatment liquid Lq1 starts. When the discharge nozzle 31 is not discharging the treatment liquid Lq1, the statistic A1 is smaller than a threshold Aref1. When the discharge nozzle 31 discharges the treatment liquid Lq1, the statistic A1 increases corresponding to the discharge and exceeds the threshold Aref1. When the discharge nozzle 31 discharges the treatment liquid Lq1 normally, the statistic A1 is smaller than a threshold Aref2. The threshold Aref2 is larger than the threshold Aref1. The threshold Aref1 and the threshold Aref2 can be set in advance by simulation or experiments and may be stored, for example, in the storage medium of the control unit 9.

On the other hand, when liquid splash occurs, the statistic A1 exceeds the threshold Aref2. In the example of FIG. 11, the liquid splash occurs immediately after the discharge of the treatment liquid Lq1 having the lowest flow rate (see graph G3). This situation may be considered as follows. That is, the reason may be considered to be that the treatment liquid Lq1 having a low flow rate is easily affected by the air flow accompanying the rotation of the substrate W, and the flow of the treatment liquid Lq1 is unstable immediately after the discharge starts.

In the example of FIG. 11, the statistic A1 greatly increases corresponding to the liquid splash. The reason is considered as follows.

That is, in the beveling treatment, because the flow rate of the treatment liquid Lq1 is low and the liquid column of the treatment liquid Lq1 is thin, in the discharge determination region R2, a ratio of an area taken up by the liquid splash part to an area taken up by the liquid-column part is relatively large. That is, in the beveling treatment, the liquid splash part having a large luminance distribution variation takes a relatively larger area.

The treatment liquid supplying unit 65 is described for comparison. In the treatment liquid supplying unit 65, the flow rate of the treatment liquid discharged from the discharge nozzle 66 is high, and thus the liquid column of the treatment liquid is thick. Hence, even if liquid splash occurs, in the discharge determination region, the ratio taken up by the liquid splash with respect to the liquid-column part does not increase as in the beveling treatment.

Besides, in the treatment liquid supplying unit 65, the gap between the discharge nozzle 66 and the substrate W is set to be wide. The reason is that the flow rate is high. In this case, the discharge determination region is set to be longer in the longitudinal direction than in the lateral direction to capture the discharge state of the treatment liquid Lq1 in a wider range. Besides, when the camera images the distal end of the discharge nozzle 66 from a direction close to the horizontal direction, in the captured image IM1, the width of the liquid splash part of the treatment liquid Lq1 in the longitudinal direction seems relatively narrow. Hence, the liquid splash part of the treatment liquid Lq1 exists below the discharge determination region only. In this case, in the discharge determination region, the ratio taken up by the liquid splash part with respect to the liquid-column part is not so large.

In contrast, in the beveling treatment, the gap between the distal end of the discharge nozzle 31 and the upper end of the substrate W is narrow, and the discharge determination region R2 is set to be laterally long. Hence, the liquid splash part of the treatment liquid Lq1 may exist from one end of the discharge determination region R2 to the other end in the longitudinal direction of the captured image IM1 (see also FIG. 10).

As described above, by setting the discharge determination region R2 that is longer in the lateral direction in the beveling treatment, when liquid splash occurs, the ratio taken up by the liquid splash part in the discharge determination region R2 greatly increases. Therefore, due to the occurrence of the liquid splash, the variance in the discharge determination region R2 greatly increases. That is, just because the discharge determination region R2 is set longer in the lateral direction in beveling treatment, the variance easily reflects presence or absence of the liquid splash.

Referring to FIG. 7, next in step S13, the control unit 9 determines whether the statistic A1 is above the threshold Aref1. When the statistic A1 is smaller than the threshold Aref1, in step S14, the control unit 9 determines that the discharge state is a discharge stopped state and ends the processing. That is, the control unit 9 determines that the treatment liquid Lq1 is not discharged yet and ends the process.

When the statistic A1 is above the threshold Aref1, in step S15, the control unit 9 determines whether the statistic A1 is smaller than the threshold Aref2. When the statistic A1 is smaller than the threshold Aref2, in step S16, the control unit 9 determines that the discharge state is a normal discharge state and ends the process. That is, the control unit 9 determines that the treatment liquid Lq1 is normally discharged and ends the process.

When the statistic A1 is above the threshold Aref2, in step S17, the control unit 9 determines that the discharge state is a liquid splash state and ends the process. That is, the control unit 9 determines that liquid splash occurs and ends the process. When it is determined that liquid splash occurs, the control unit 9 may make the notification unit 93 notify of the occurrence of the liquid splash. Accordingly, the operator can realize that liquid splash occurs.

As described above, according to the treatment unit 1, the discharge state (presence or absence of the discharge and presence or absence of the liquid splash) of the treatment liquid Lq1 in the beveling treatment can be appropriately determined. Besides, the statistic A1 used to determine the presence or absence of the discharge can be used to determine the presence or absence of the liquid splash, and thus the calculation process is easy.

Moreover, in the above example, variance is employed as the statistic A1, but the disclosure is not limited hereto. A sum (or average, the same hereinafter) of the pixel values of the pixels in the discharge determination region R2 may be employed as the statistic A1. The reason is that, in the discharge determination region R2, the pixel values of the pixels corresponding to the treatment liquid Lq1 is higher than the pixel values of other pixels (see also FIG. 9). That is, the sum increases due to the discharge of the treatment liquid Lq1. In other words, the sum is a value reflecting the presence or absence of the discharge of the treatment liquid Lq1.

The sum is also a value reflecting the presence or absence of the liquid splash. The reason is described as follows. As illustrated in FIG. 10, when the liquid splash occurs, the treatment liquid Lq1 takes up a wider region in the discharge determination region R2. That is, the number of the pixels having a high luminance value further increases in the discharge determination region R2, and the sum of the pixel values in the discharge determination region R2 further increases.

The tendency of the change of the sum corresponding to the presence or absence of the discharge and the presence or absence of the liquid splash is the same as in the graph in FIG. 11. Hence, the sum can be employed as the statistic A1.

Moreover, the same as in the case of variance, the reason for the great increase in the sum due to the presence or absence of the liquid splash is considered to be that the discharge determination region R2 is set longer in the lateral direction in the beveling treatment. That is, in the discharge determination region R2 that is long in the lateral direction in the beveling treatment, the ratio taken up by the liquid splash part with respect to the liquid-column part is large. Therefore, the sum of the pixel values in the discharge determination region R2 greatly increases compared with a case that the treatment liquid Lq1 is normally discharged. That is, in the beveling treatment, the sum easily reflects the presence or absence of the liquid splash of the treatment liquid Lq1.

<Liquid Splash Determination Region>

In the example described above, the presence or absence of the liquid splash is determined based on the pixel values of the pixels in the discharge determination region R2. However, a liquid splash determination region R3 different from the discharge determination region R2 may be set. Similar to the discharge determination region R2, the liquid splash determination region R3 is set in advance corresponding to the position of the discharge nozzle 31 in the captured image IM1. That is, the relative position between the discharge nozzle 31 and the liquid splash determination region R3 in the captured image IM1 is set in advance. Information indicating the relative position is stored, for example, in the storage medium of the control unit 9.

In the example of FIG. 8 and FIG. 11, the liquid splash determination region R3 is set separated from the discharge determination region R2 in the captured image IM1. More specifically, the liquid splash determination region R3 is set at the downstream side in the rotation direction with respect to the discharge determination region R2. In other words, the liquid splash determination region R3 may not be set at the upstream side in the rotation direction with respect to the discharge determination region R2. The reason is as follows. That is, in the beveling treatment, the treatment liquid Lq1 is easily affected by the air flow accompanying the rotation of the substrate W, and thus the liquid splash occurs mainly at the downstream side in the rotation direction with respect to the arrival position of the treatment liquid Lq1. Therefore, the liquid splash determination region R3 is set in a region where the liquid splash occurs easily, and the liquid splash determination region R3 is not set in a region where the liquid splash is unlikely to occur.

In the example in FIG. 8 and FIG. 11, the liquid splash determination region R3 has a rectangular shape, the width in the lateral direction is smaller than that of the discharge determination region R2, and the width in the longitudinal direction is wider than that of the discharge determination region R2. Accordingly, the liquid splash can be more effectively included in the liquid splash determination region R3.

When the liquid splash does not occur, because only the upper surface of the substrate W is included in the liquid splash determination region R3, the pixel values of the pixels in the liquid splash determination region R3 are small, and the distribution variation is also small. In contrast, when the liquid splash occurs, because the liquid splash part of the treatment liquid Lq1 is included in the liquid splash determination region R3, the pixel values of the pixels corresponding to the liquid splash part increase.

Therefore, the control unit 9 calculates a statistic B1 based on the pixel values of the pixels in the liquid splash determination region R3. The statistic B1 is a value reflecting the presence or absence of the liquid splash and is, for example, a sum or variance of the pixel values in the liquid splash determination region R3. Similar to the statistic A1, the statistic B1 increases due to the occurrence of the liquid splash.

Figure 12:
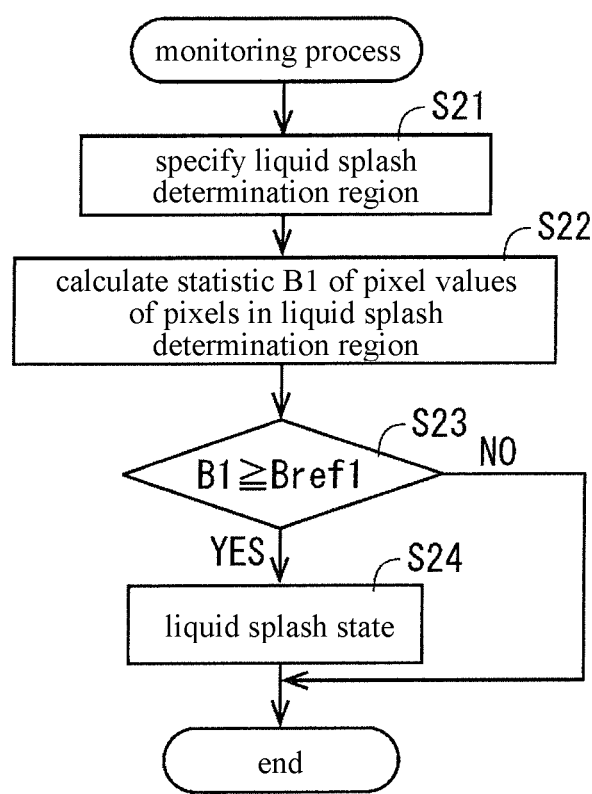
FIG. 12 is a flow chart illustrating an example of the monitoring process.

FIG. 12 is a flow chart showing an example of the monitoring process. The process flow shown in FIG. 12 is executed, for example, every time the captured image IM1 is input to the control unit 9. First, in step S21, the control unit 9 specifies the liquid splash determination region R3 in the captured image IM1. Specifically, according to the pattern matching based on the reference image, the control unit 9 specifies the position of the discharge nozzle 31 in the captured image IM1, and specifies the liquid splash determination region R3 based on a predetermined relative position relationship with respect to the specified discharge nozzle 31. Accordingly, even when the position of the discharge nozzle 31 changes in the captured image IM1, the liquid splash determination region R3 can be appropriately specified corresponding to the position of the discharge nozzle 31.

Next, in step S22, the control unit 9 calculates the statistic B1 of the pixel values of the pixels in the liquid splash determination region R3. Next, in step S23, the control unit 9 determines whether the statistic B1 is above a threshold Bref1. The threshold Bref1 is set in advance by, for example, simulation or experiments, and may be stored in the storage medium of the control unit 9.

When the statistic B1 is above the threshold Bref1, in step S24, the control unit 9 determines that the discharge state is the liquid splash state and ends the process. That is, the control unit 9 determines that the liquid splash occurs and ends the process.

On the other hand, when the statistic B1 is smaller than the threshold Bref1, the control unit 9 ends the process without executing step S24.

In this way, the control unit 9 can appropriately determine the presence or absence of the liquid splash based on the pixel value in the liquid splash determination region R3.

In addition, in the example above, the liquid splash determination region R3 is not set at the upstream side in the rotation direction with respect to the discharge determination region R2. Hence, calculation processing related to the liquid splash determination region R3 is not performed, and thus processing load can be reduced.

Moreover, in the example above, as the variance being an example of the statistic A1, the variance of the pixel values of all pixels in the discharge determination region R2 is employed. However, the pixel values of the pixels lined up in the longitudinal direction may be integrated for each column and the variance of a plurality of integration values of the plurality of columns may be employed. The same applies to the statistic B1.

<Fixation of Camera>

In the example above, similar to the discharge nozzle 61, the camera 70 is also fixed to the fixing member 62. That is, the mechanism for moving the camera 70 is also used as the mechanism for moving the discharge nozzle 61. Hence, compared with a case that dedicated mechanisms are arranged respectively, the manufacturing cost and the size can be reduced.

Figure 13:
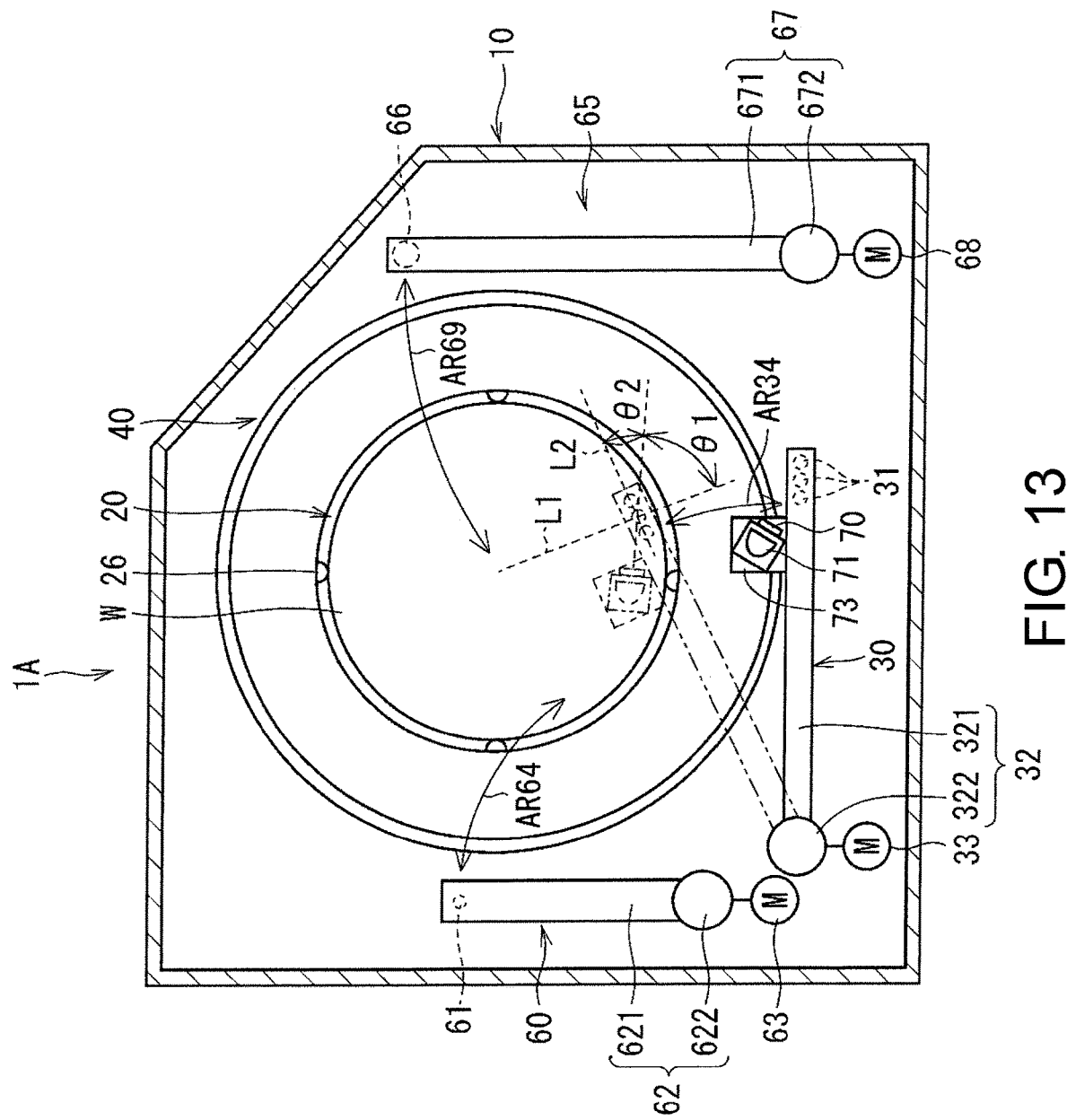
FIG. 13 is a plan view illustrating an example of a schematic configuration of the treatment unit.

FIG. 13 is a plan view schematically showing an example of a configuration of a treatment unit 1A. The treatment unit 1A has the same configuration as the treatment unit 1 except for a fixation object of the camera 70. In the treatment unit 1A, the same as the discharge nozzle 31 which is the imaging object, the camera 70 is also fixed to the fixing member 32. More specifically, the camera holding unit 73 is coupled to the nozzle arm 321 at a lateral side of the nozzle arm 321. The camera holding unit 73 holds the camera 70. The camera 70 is fixed to the fixing member 32 via the camera holding unit 73. The camera 70 and the camera holding unit 73 are disposed at the counterclockwise direction side (that is, the side directed to the treatment position from the standby position of the discharge nozzle 31) with respect to the nozzle arm 321. In addition, the camera 70 is held on the camera holding unit 73 in a posture at which the distal end of the discharge nozzle 31 and the treatment liquid Lq1 discharged from the discharge nozzle 31 can be imaged.

By turning the nozzle base 322, the movement mechanism 33 can move the discharge nozzle 31 and the camera 70 to the treatment position and the imaging position respectively while maintaining the position relationship. The position relationship between the imaging position of the camera 70 and the treatment position of the discharge nozzle 31 is the same as in the case of the treatment unit 1.

According to the treatment unit 1A, the camera 70 can also appropriately image the substantially liquid-column shaped treatment liquid Lq1 discharged from the discharge nozzle 31 as in the treatment unit 1.

In addition, because the camera 70 is fixed to the fixing member 32 like the discharge nozzle 31, the camera 70 can be positioned with a high precision with respect to the discharge nozzle 31. That is, in the treatment unit 1, the discharge nozzle 31 and the camera 70 are fixed to mutually different nozzle arms 321 and 621, and thus in view of the precision of the movement mechanism 33 and 63, a relatively wide margin is required to be arranged between the camera 70 and the nozzle arm 321. In contrast, in the treatment unit 1A, the discharge nozzle 31 and the camera 70 are fixed to the same nozzle arm 321, and thus the margin between the camera 70 and the nozzle arm 321 can be set to be narrower. That is, the camera 70 can be brought closer to the nozzle arm 321. Accordingly, the camera 70 can image the discharge nozzle 31 from a direction closer to the periphery direction. Hence, in the captured image IM1, the discharge position of the treatment liquid Lq1 in the radial direction is easily specified.

<Camera Protection>

When the treatment liquid Lq1 contains fluorinated acid, a lower surface of the housing of the camera 70 or a lower end surface of the lower member 734 of the camera holding unit 73 may be formed of a chemical resistant material. In short, a protection member 74 that protects the camera 70 may be arranged at a lower surface side of the camera 70. As the protection member 74, chemical resistant resins such as fluororesin like polytetrafluoroethylene or vinyl chloride resin, or metals such as stainless steel, which have high chemical resistance to fluorinated acid, may be employed.

Accordingly, possibility that the camera 70 located above the substrate W is corroded by the gasified components of the treatment liquid Lq1 can be reduced. Hence, reliability of the camera 70 can be improved.

<Discharge Determination Region R2>

Figure 14:
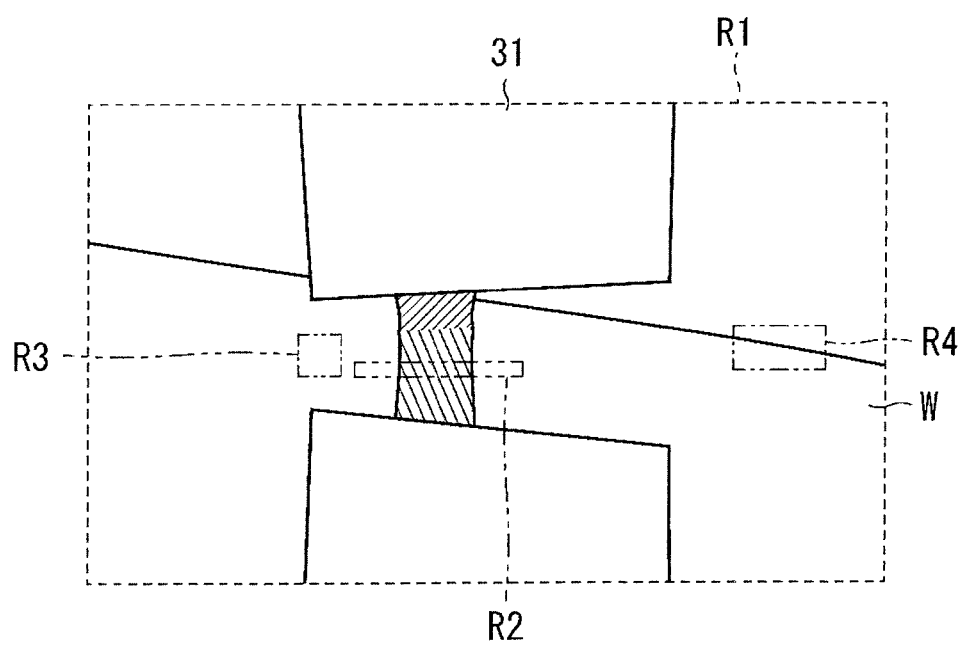
FIG. 14 is a diagram schematically illustrating an example of the captured image.

FIG. 14 is a diagram schematically showing another example of the region R1 of the captured image IM1. In the captured image IM1 illustrated in FIG. 11, the discharge nozzle 31 is included in the upper surface of the substrate W. The reason is that, after the light from the illumination unit 71 is reflected at the discharge nozzle 31, the light is mirror-reflected on the upper surface of the substrate W and received by the light reception surface of the camera 70. That is, the upper surface of the substrate W functions as a mirror, and the external appearance of the discharge nozzle 31 is reflected on the upper surface.

In the above captured image IM1, the discharge determination region R2 may be set so as to include part of the substantially liquid-column shaped treatment liquid Lq1 (liquid-column part) reflected on the upper surface of the substrate W. That is, in the captured image IM1, the discharge determination region R2 may be set so as to cross the substantially liquid-column shaped treatment liquid Lq1 reflected on the upper surface of the substrate W.

The control unit 9 can specify the liquid-column width and the discharge position of the treatment liquid Lq1 in the discharge determination region R2 by imaging process the same as the aforementioned imaging process.

Besides, in this embodiment, the optical axis of the camera 70 further goes along a horizontal direction, and thus in the captured image IM1, the longitudinal length of the treatment liquid Lq1 reflected on the upper surface of the substrate W is longer than the length of the treatment liquid Lq1 between the discharge nozzle 31 and the substrate W. Accordingly, the discharge determination region R2 is easily set so as to cross the treatment liquid Lq1. In addition, the longitudinal width of the discharge determination region R2 can be set to be wider.

Meanwhile, on the upper surface of the substrate W, various patterns such as metal pattern, semiconductor pattern, insulation layer pattern and resist pattern may be formed. Hence, the treatment liquid Lq1 reflected on the upper surface of the substrate W is affected by these patterns. Accordingly, a profile of the treatment liquid Lq1 may be blurred.

Therefore, an exposure time of the camera 70 may be set longer than a rotation time required for the substrate W to rotate one round. Accordingly, the pattern of the substrate W in the captured image IM1 is averaged to be uniformed, and thus the profile of the treatment liquid Lq1 in the captured image IM1 can be emphasized. Accordingly, a specific precision of two end positions of the treatment liquid Lq1 can be improved, and the liquid-column width and the discharge position can be obtained with a higher precision.

Alternatively, the exposure time may be shorter than the rotation time. The control unit 9 may integrate or average a plurality of the captured images IM captured in a predetermined time longer than the rotation time to generate processed image for each predetermined time. In the processed image of each predetermined time, the pattern of the upper surface of the substrate W is averaged to be uniformed, and thus the profile of the treatment liquid Lq1 can be emphasized.

In the example above, the discharge determination region R2 is described, but the same applied to the liquid splash determination region R3.

<Position of Discharge Nozzle 31>

The treatment position of the discharge nozzle 31 may be controlled based on the captured image IM1. The detail is described below.

The treatment position of the discharge nozzle 31 is a position separated from the peripheral edge of the substrate W by a predetermined width. Therefore, the control unit 9 specifies the position of the peripheral edge of the substrate W (hereinafter, referred to as substrate peripheral edge position) in the captured image IM1. First, the control unit 9 specifies a peripheral edge region R4 in the captured image IM1, the peripheral edge region R4 being described below.

The peripheral edge region R4 is a region in the captured image IM1 including part of the peripheral edge of the substrate W. In the example of FIG. 8, the peripheral edge region R4 has a rectangular shape. Similar to the discharge determination region R2, the position of the peripheral edge region R4 is set in advance corresponding to the discharge nozzle 31. That is, the relative position relationship between the discharge nozzle 31 and the peripheral edge region R4 is set in advance. Information indicating the position relationship may be stored in the storage medium of the control unit 9.

According to the pattern matching, the control unit 9 specifies the position of the discharge nozzle 31 in the captured image IM1, and specifies the peripheral edge region R4 based on the position of the specified discharge nozzle 31. Then, the control unit 9 specifies the substrate peripheral edge position of the substrate W in the peripheral edge region R4. For example, the control unit 9 specifies the peripheral edge of the substrate W based on image processing such as edge detection processing and the like. Accordingly, the substrate peripheral edge position of the substrate W taking the position of the discharge nozzle 31 as a reference can be specified.

The control unit 9 may determine the treatment position of the discharge nozzle 31 based on the substrate peripheral edge position. For example, the captured image IM1 is acquired in advance when the discharge nozzle 31 is stopped at a correct treatment position, obtains in advance the substrate peripheral edge position in the peripheral edge region R4 in the captured image IM1, and stores the substrate peripheral edge position in advance as a reference position in the storage medium of the control unit 9.

The control unit 9 compares the specified substrate peripheral edge position and the reference position and adjusts the position of the discharge nozzle 31 so as to reduce a difference. For example, when the substrate peripheral edge position is shifted to the left from the reference position in the captured image IM1, the control unit 9 controls the movement mechanism 33 to move the discharge nozzle 31 to the central side of the substrate W, and when the substrate peripheral edge position is shifted to the right from the reference position, the control unit 9 controls the movement mechanism 33 to move the discharge nozzle 31 to the peripheral edge side of the substrate W. Accordingly, the discharge nozzle 31 can be moved to a position that becomes the central portion of the substrate W by a predetermined width from the substrate peripheral edge position.

<Imaging Optical System>

Figure 15:
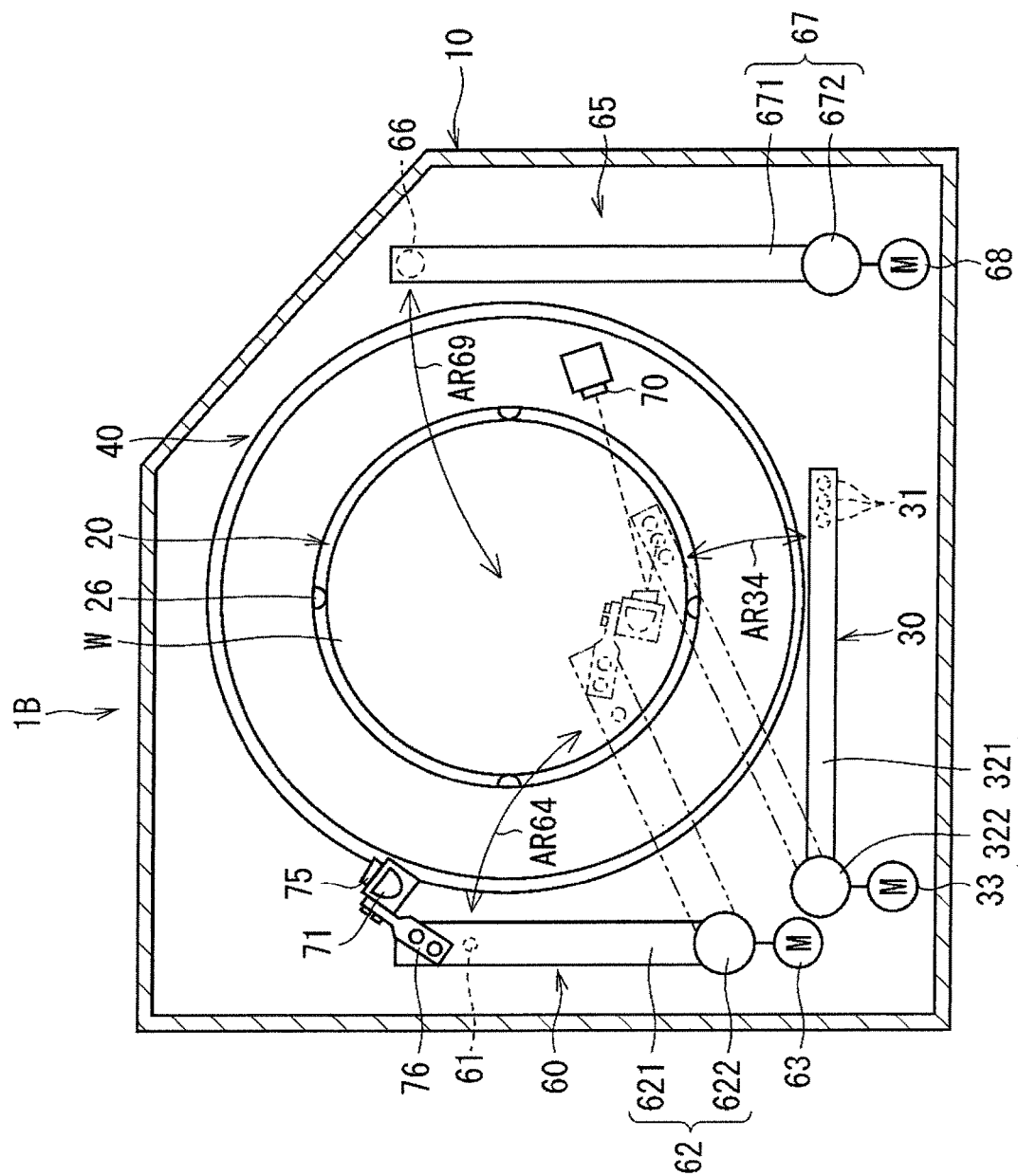
FIG. 15 is a plan view illustrating an example of a schematic configuration of the treatment unit.

FIG. 15 is a diagram schematically showing an example of a configuration of a treatment unit 1B. The treatment unit 1B has the same configuration as the treatment unit 1 except for an imaging optical system. In the treatment unit 1B, a mirror 75 is arranged. The mirror 75 is disposed at the imaging position above the substrate W, and the camera 70 is disposed in a region other than the above of the substrate W. As illustrated in FIG. 15, the camera 70 may be positioned above the treatment cup 40 in a plan view. The mirror 75 reflects the light coming from the imaging region toward the light reception surface of the camera 70. Hence, the camera 70 can image the imaging region seen from the imaging position above the substrate W.

As illustrated in FIG. 15, the mirror 75 may be arranged to be movable. In the example of FIG. 15, the mirror 75 is fixed to the fixing member 62 of the treatment liquid supplying unit 60. As a more specific example, a mirror holding unit 76 that holds the mirror 75 is arranged, and the mirror holding unit 76 is coupled to the nozzle arm 621 of the fixing member 62. For example, the mirror holding unit 76 is fixed, at the base end side, to a distal end portion of the nozzle arm 621 by a fastening member (for example, a screw), and fixes and holds the mirror 75 by a fastening member at the distal end side of the mirror holding unit 76. The mirror holding unit 76 is formed of, for example, metal (for example, stainless steel) and the like. By turning the nozzle base 622, the movement mechanism 63 can make the mirror 75 reciprocate between the imaging position above the substrate W and the standby position at the outer side of the treatment cup 40. The movement mechanism 63 moves the mirror 75 to the imaging position, and thereby the light from the imaging region can be reflected from the mirror 75 to the camera 70.

The position relationship between the position of the mirror 75 (imaging position) and the discharge nozzle 31 in a plan view is the same as the position relationship between the position of the camera 70 (imaging position) and the discharge nozzle 31 in the treatment unit 1. The imaging position is desirably close to the substrate W. For example, the imaging position may be set in a manner that a lower end of a reflection surface of the mirror 75 is positioned at the same height as the upper end position of the treatment cup 40 or lower than the upper end position. Alternatively, when the mirror holding unit 76 has a lower member disposed at a lower side of the mirror 75, the imaging position may be set in a manner that the lower end of the lower member is positioned at the same height as the upper end position of the treatment cup 40 or lower than the upper end position. Accordingly, the camera 70 can image the imaging region seen from the imaging position along a direction closer to the horizontal direction. That is, the imaging direction from the imaging position is easily made to be closer to the horizontal direction.

According to the treatment unit 1B, the camera 70 can be disposed at a region other than the above of the substrate W, and thus the influence of the treatment liquid Lq1 on the camera 70 can be reduced. For example, possibility that the treatment liquid Lq1 is attached to the camera 70 or the gasified components of the treatment liquid Lq1 is attached to the camera 70 can be reduced. Hence, even if the treatment liquid Lq1 contains fluorinated acid, the camera 70 is unlikely to corrode.

Moreover, the camera 70 may be substantially immovably fixed in the treatment unit 1B or be movably fixed in the treatment unit 1B.

In addition, the mirror 75 is not required to be fixed to the fixing member 62 of the treatment liquid supplying unit 60, and may be fixed, similar to the camera 70 of the treatment unit 1A, to the fixing member 32 of the treatment liquid supplying unit 30. Accordingly, the mirror 75 can be brought closer to the nozzle arm 321, and thus the imaging direction from the imaging position is easily made to be closer to the periphery direction.

<Machine Learning>

In the example above, the control unit 9 performs image processing on the captured image IM1 to determine the presence or absence of the discharge of the treatment liquid Lq1 and the presence or absence of the liquid splash. However, the control unit 9 may use machine learning to perform the determination.

Figure 16:
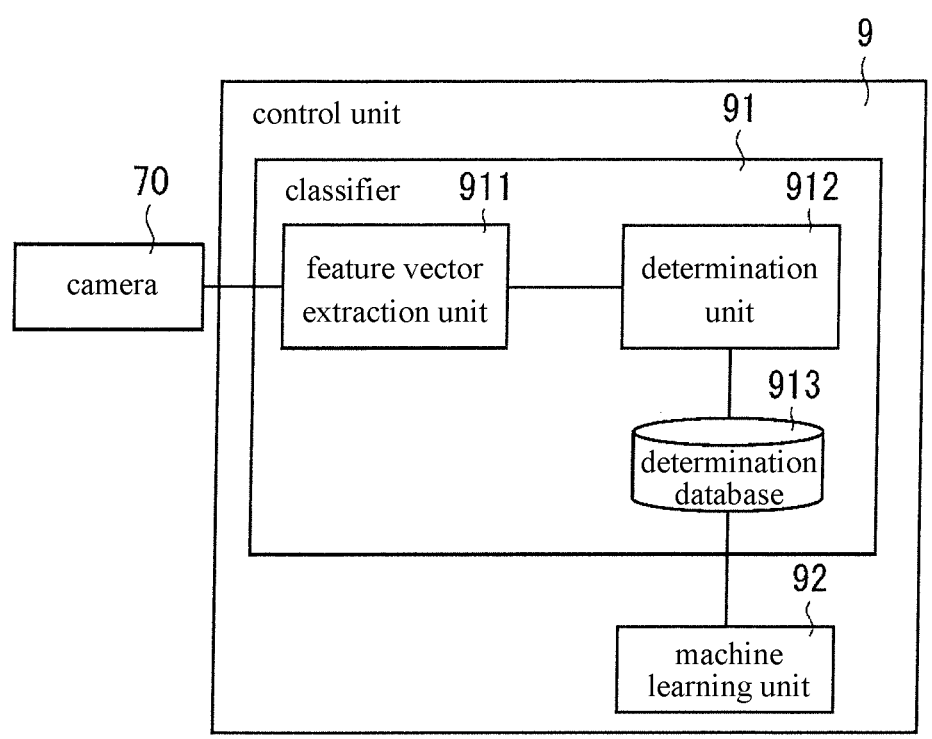
FIG. 16 is a functional block diagram schematically illustrating an example of an internal configuration of a control unit.

FIG. 16 is a diagram schematically showing an example of an internal configuration of the control unit 9. The control unit 9 includes a classifier 91 and a machine learning unit 92. The captured images IM1 from the camera 70 are sequentially input to the classifier 91. The classifier 91 classifies the input captured images IM1 into categories related to the discharge state of the discharge nozzle 31. The categories may also be called classes. A first category indicating discharge stop, a second category indicating normal discharge, and a third category indicating liquid splash can be employed as the category.

The classifier 91 is generated by the machine learning unit 92 using a plurality of teaching data. That is, the classifier 91 can be regarded as a classifier after machine learning. The machine learning unit 92 uses, for example, nearest neighbor algorithm, support vector machine, random forest, neural network (including deep learning) or the like as an algorithm of the machine learning. Because the neural network automatically generates feature amounts, a designer is not required to decide feature vector.

The teaching data includes image data and labels indicating which category the image data is classified to. The image data is the captured image captured by the camera 70 and is generated in advance. Correct category is added to each image data as the label. This addition can be performed by the operator. Based on the teaching data, the machine learning unit 92 performs machine learning to generate the classifier 91.

As an example, the classifier 91 that classifies frames according to nearest neighbor algorithm is described. The classifier 91 includes a feature vector extraction unit 911, a determination unit 912, and a storage medium in which a determination database 913 is stored. Each frame of the captured image from the camera 70 is sequentially input to the feature vector extraction unit 911. The feature vector extraction unit 911 extracts feature vectors of the captured image IM1 in accordance with a predetermined algorithm. The feature vectors are vectors that indicate the feature amounts corresponding to the discharge state of the discharge nozzle 31. A known algorithm can be employed as the algorithm. The feature vector extraction unit 911 outputs the feature vectors to the determination unit 912.

In the determination database 913, a plurality of feature vectors (hereinafter, referred to as reference vector) generated by the machine learning unit 92 from a plurality of teaching data is stored, and the reference vectors are classified into each category. Specifically, the machine learning unit 92 applies the same algorithm as in the feature vector extraction unit 911 to a plurality of teaching data to generate a plurality of reference vectors. Then, the machine learning unit 92 imparts the label of teaching data (correct category) to the reference vector.

The determination unit 912 classifies the captured image IM1 based on the feature vectors input from the feature vector extraction unit 911 and the plurality of reference vectors stored in the determination database 913. For example, the determination unit 912 may specify the reference vector closest to the feature vector and classify the captured image IM1 into the category of the specified reference vector (nearest neighbor algorithm). Accordingly, the determination unit 912 can classify the captured images input to the classifier 91 (the feature vector extraction unit 911) into categories.

The control unit 9 classifies, by the classifier 91, each of the captured images IM1 into any one of the first category to the third category. The classification means to determine whether the discharge state amount of the treatment liquid Lq1 is in a proper range. Because the classification is performed by machine learning, abnormality can be detected with high precision.

<Input to Classifier>

In the example above, the whole region of the captured image IM1 is employed as input data to the classifier 91, but the disclosure is not limited hereto. For example, the control unit 9 may cut off an image of the discharge determination region R2 in the captured image IM1 and input the image to the classifier 91. In this case, the image representing the discharge determination region R2 is also employed as learning data input to the machine learning unit 92.

Accordingly, the classifier 91 can perform the classification eliminating the influence of the region remotely related to the discharge state, and thus the classification precision can be improved.

In addition, when the discharge determination region R2 has a width corresponding to two or more pixels as the width in the longitudinal direction, as the input data to the classifier 91, an integration value group including integration values for each column may be employed, the integration value being a sum of pixel values lined up in a column in the longitudinal direction of the discharge determination region R2.

<Server>

In the example above, the control unit 9 arranged in the substrate treatment device 100 generates the classifier 91 by machine learning and classifies frames by the classifier 91. However, at least part of the machine learning function of the control unit 9 (the classifier 91 and the machine learning unit 92) may be arranged in a server.

The embodiments of the substrate treatment device are described above; however, the embodiments may be variously modified beyond the aforementioned situations in a scope not departing from the gist of the disclosure. The above embodiments and variation examples can be appropriately combined to be implemented.

In addition, the semiconductor substrate is employed as the substrate W for description, but the disclosure is not limited hereto. For example, substrates such as a glass substrate for photo mask, a glass substrate for liquid crystal display, a glass substrate for plasma display, a substrate for FED (Field Emission Display), a substrate for optical disk, a substrate for magnetic disk, a substrate for optical magnetic disk and the like may be employed.

What is claimed is:

1. A substrate treatment method, comprising:
a holding process in which a substrate is held on a substrate holding unit;
a rotation process in which the substrate holding unit is rotated to rotate the substrate;
a raising process in which a cup member surrounding an outer periphery of the substrate holding unit is raised to locate an upper end of the cup member at an upper end position that is higher than an upper surface of the substrate held on the substrate holding unit;
a beveling treatment process in which a treatment liquid is discharged from a discharge port of at least one nozzle located lower than the upper end position to an end portion of the upper surface of the substrate held on the substrate holding unit;
an imaging process in which a camera is made to image an imaging region to acquire captured images, wherein the imaging region contains the treatment liquid discharged from the discharge port of the at least one nozzle and is seen from an imaging position above the substrate held on the substrate holding unit; and
a monitoring process which comprises: a process in which a determination is made on whether a first statistic of luminance values of pixels in a discharge determination region is above a first threshold, and when the first statistic is above the first threshold, the determination is made that the treatment liquid is discharged from the at least one nozzle, wherein the discharge determination region is located right below the at least one nozzle in the captured image and is longer in a lateral direction than in a longitudinal direction, and a process in which a determination is made on whether the first statistic is above a second threshold larger than the first threshold, and when the first statistic is above the second threshold, the determination is made that liquid splash in which the treatment liquid splashes back on the upper surface of the substrate occurs.

2. The substrate treatment method according to claim 1, wherein
in the monitoring process,
the captured images are classified, by a classifier after machine learning, into categories indicating a discharge state of the treatment liquid discharged from a distal end of the at least one nozzle.

3. The substrate treatment method according to claim 2, wherein
in the monitoring process,
a discharge determination region is cut off from the captured image and an image obtained by cutting off the discharge determination region is input into the classifier, wherein the discharge determination region is located right below the at least one nozzle and is longer in the lateral direction than in the longitudinal direction.

4. The substrate treatment method according to claim 1, wherein
a part of a peripheral edge of the substrate is included in the captured image, and
the beveling treatment process comprises:
a process in which a substrate peripheral edge position of the part of the peripheral edge of the substrate is obtained based on the captured image; and
a process in which the at least one nozzle is moved from the substrate peripheral edge position toward a treatment position in a central portion of the substrate by a predetermined width.

5. A substrate treatment method, comprising:
a holding process in which a substrate is held on a substrate holding unit;
a rotation process in which the substrate holding unit is rotated to rotate the substrate;
a raising process in which a cup member surrounding an outer periphery of the substrate holding unit is raised to locate an upper end of the cup member at an upper end position that is higher than an upper surface of the substrate held on the substrate holding unit;
a beveling treatment process in which a treatment liquid is discharged from a discharge port of at least one nozzle located lower than the upper end position to an end portion of the upper surface of the substrate held on the substrate holding unit;
an imaging process in which a camera is made to image an imaging region to acquire captured images, wherein the imaging region contains the treatment liquid discharged from the discharge port of the at least one nozzle and is seen from an imaging position above the substrate held on the substrate holding unit; and
a monitoring process in which a discharge state of the treatment liquid is determined based on the captured images,
wherein the monitoring process comprises:
a process in which a determination is made on whether a first statistic of luminance values of pixels in a discharge determination region is above a first threshold, and when the first statistic is above the first threshold, the determination is made that the treatment liquid is discharged from the at least one nozzle, wherein the discharge determination region is located right below the at least one nozzle in the captured image and is longer in a lateral direction than in a longitudinal direction, and
a process in which a determination is made, based on luminance values of pixels in a liquid splash determination region, on whether liquid splash in which the treatment liquid splashes back on the upper surface of the substrate occurs, wherein the liquid splash determination region is set at a downstream side in a rotation direction of the substrate with respect to the discharge determination region in the captured image.

6. The substrate treatment method according to claim 5, wherein
the liquid splash determination region is not set at an upstream side in the rotation direction of the substrate with respect to the discharge determination region in the captured image.

7. A substrate treatment method, comprising:
a holding process in which a substrate is held on a substrate holding unit,
a rotation process in which the substrate holding unit is rotated to rotate the substrate;
a raising process in which a cup member surrounding an outer periphery of the substrate holding unit is raised to locate an upper end of the cup member at an upper end position that is higher than an upper surface of the substrate held on the substrate holding unit;
a beveling treatment process in which a treatment liquid is discharged from a discharge port of at least one nozzle located lower than the upper end position to an end portion of the upper surface of the substrate held on the substrate holding unit;
an imaging process in which a camera is made to image an imaging region to acquire captured images, wherein the imaging region contains the treatment liquid discharged from the discharge port of the at least one nozzle and is seen from an imaging position above the substrate held on the substrate holding unit; and
a monitoring process in which a discharge state of the treatment liquid is determined based on the captured images,
wherein the monitoring process comprises:
a process in which a determination is made on whether a first statistic of luminance values of pixels in a discharge determination region is above a first threshold, and when the first statistic is above the first threshold, the determination is made that the treatment liquid is discharged from the at least one nozzle, wherein the discharge determination region is located right below the at least one nozzle in the captured image and is longer in a lateral direction than in a longitudinal direction, and
wherein the discharge determination region is set at a position in the captured image where a part of the treatment liquid reflected on the upper surface of the substrate due to minor reflection is included.

8. The substrate treatment method according to claim 7, wherein an exposure time of the camera is set longer than the time required for the substrate to rotate one round.

9. The substrate treatment method according to claim 7, wherein
the first statistic is calculated for the luminance values of the pixels in the discharge determination region in the captured image obtained by integrating or averaging a plurality of captured images, wherein the plurality of captured images is acquired by the camera in a period of time equal to or longer than the time required for the substrate to rotate one round.

10. A substrate treatment method, comprising:
a holding process in which a substrate is held on a substrate holding unit;
a rotation process in which the substrate holding unit is rotated to rotate the substrate;
a raising process in which a cup member surrounding an outer periphery of the substrate holding unit is raised to locate an upper end of the cup member at an upper end position that is higher than an upper surface of the substrate held on the substrate holding unit;
a beveling treatment process in which a treatment liquid is discharged from a discharge port of at least one nozzle of a plurality of nozzles located lower than the upper end position to an end portion of the upper surface of the substrate held on the substrate holding unit;
an imaging process in which a camera is made to image an imaging region to acquire captured images at an imaging position above the substrate held on the substrate holding unit, wherein the imaging region contains the treatment liquid discharged from the discharge port of the at least one nozzle and is seen from the imaging position; and
a monitoring process in which a discharge state of the treatment liquid is determined based on the captured images,
wherein in a plan view the imaging position is positioned at a central side of the substrate with respect to the plurality of nozzles and located at an upstream side in a rotation direction of the substrate holding unit with respect to the plurality of nozzles, and
the plurality of nozzles are not overlapped each other as being seen from the imaging position and the plurality of nozzles are mutually shifted in the depth direction along an optical axis of the camera in the imaging process, the camera is made to image the imaging region to acquire captured images at the imaging position, and in the captured images, images of the plurality of nozzles are mutually shifted in the depth direction along the optical axis of the camera and the images of the plurality of nozzles are not overlapped each other.

\* \* \* \* \*